(12) United States Patent
Miura

(10) Patent No.: US 9,069,662 B2
(45) Date of Patent: *Jun. 30, 2015

(54) SEMICONDUCTOR DEVICE AND METHOD OF CONTROLLING NON-VOLATILE MEMORY DEVICE

(71) Applicant: Hitachi, Ltd., Tokyo (JP)

(72) Inventor: Seiji Miura, Hachioji (JP)

(73) Assignee: Hitachi, Ltd., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/514,178

(22) Filed: Oct. 14, 2014

(65) Prior Publication Data
US 2015/0032949 A1 Jan. 29, 2015

Related U.S. Application Data

(63) Continuation of application No. 13/443,883, filed on Apr. 10, 2012, now Pat. No. 8,984,209.

(30) Foreign Application Priority Data

Apr. 12, 2011 (JP) .................. 2011-88032

(51) Int. Cl.
*G06F 12/02* (2006.01)
*G11C 13/00* (2006.01)

(52) U.S. Cl.
CPC .... *G06F 12/0246* (2013.01); *G06F 2212/7211* (2013.01); *G11C 13/0004* (2013.01); *G06F 2212/7202* (2013.01); *G06F 2212/7209* (2013.01)

(58) Field of Classification Search
CPC .............. G06F 12/0246; G06F 2212/7209; G06F 2212/7202; G06F 2212/7211; G11C 13/0004

USPC .......................................... 711/103
See application file for complete search history.

(56) References Cited

U.S. PATENT DOCUMENTS 5,530,827 A 6/1996 Matsui et al.
6,421,274 B1 7/2002 Yoshimura
(Continued)

FOREIGN PATENT DOCUMENTS

JP 5-151097 A 6/1993
JP 6-282484 A 10/1994
(Continued)

OTHER PUBLICATIONS

Kwang-Jin Lee et al., "A 90nm 1.8V 512Mb Diode-Switch PRAM with 266MB/s Read Throughput", IEEE International Solid-State Circuits Conference, Digest of Technical Papers, US, 2007, pp. 472-473.

(Continued)

*Primary Examiner* — John Lane
(74) *Attorney, Agent, or Firm* — Miles & Stockbridge P.C.

(57) ABSTRACT

A control circuit of a semiconductor device (memory module) realizes long life and others by a mechanism that suppresses and smoothes variations in use of a memory by equalizing the sizes of data write and data erase with respect to a data write request and sequentially allocating and using addresses of the memory in data write to an overwritable non-volatile memory device without carrying out an overwriting operation even in the case of an overwrite request. The control circuit realizes data write by a set of two types of operations of (a) an operation of erasing data of a first address or an operation of setting a flag value to an invalid state and (b) an operation of writing data to a second address different from the first address or an operation of setting a flag value to a valid state.

7 Claims, 16 Drawing Sheets

(56) References Cited

U.S. PATENT DOCUMENTS

| | | |
|---|---|---|
| 6,539,453 B1 | 3/2003 | Guterman |
| 8,773,919 B2 | 7/2014 | Miura et al. |
| 2004/0151031 A1 | 8/2004 | Tanaka |
| 2012/0059978 A1 | 3/2012 | Rosenband et al. |
| 2012/0072644 A1 | 3/2012 | Asano et al. |
| 2012/0134203 A1 | 5/2012 | Miura et al. |
| 2012/0173795 A1 | 7/2012 | Schuette et al. |

FOREIGN PATENT DOCUMENTS

| | | |
|---|---|---|
| JP | 07-153285 A | 6/1995 |
| JP | 2002-288034 A | 10/2002 |
| JP | 2002-533810 A | 10/2002 |
| JP | 2003-208352 A | 7/2003 |
| JP | 2004-240572 A | 8/2004 |
| JP | 2008-146255 A | 6/2008 |
| JP | 2010-250534 A | 11/2010 |
| WO | WO 2010/038736 A1 | 4/2010 |

OTHER PUBLICATIONS

Stefan Lai, "OUM A 180 nm Nonvolatile Memory Cell Element Technology for Stand Alone and Embedded Applications", IEEE International Electron Devices Meeting, Technical Digest, US, 2001, pp. 803-806.

Cho et al., "A 0.18-μm 3.0-V 64-Mb Nonvolatile Phase-Transition Random Access memory (PRAM)", IEEE Journal of Solid-State Circuits, vol. 40, No. 1, Jan. 2005, pp. 293-300.

Data Sheet of NAND-type flash (TC58NVG2S3ETA00) "Toshiba MOS Digital integrated Circuit Silicon Gate CMOS", pp. 1-70.

FIG. 5

| PAT | | | |
|---|---|---|---|
| PA [31:0] | | VF | EC |
| PA [31:20] (PSA) | PA [19:0] (PPA) | 0: invalid 1: valid | (Erase Count) |
| 0 | 0 | 0 | 500 |
| ⋮ | 1 | 1 | 100 |
| | 2 | 0 | 300 |
| | ⋮ | ⋮ | ⋮ |
| 0 | F_FFFF | 0 | 200 |
| 1 | 0 | 0 | 10 |
| ⋮ | 1 | 0 | 20 |
| | 2 | 0 | 30 |
| | 3 | 0 | 40 |
| | ⋮ | ⋮ | ⋮ |
| 1 | F_FFFF | 0 | 100 |
| ⋮ | ⋮ | ⋮ | ⋮ |
| FFF | 0 | 0 | 30 |
| ⋮ | 1 | 0 | 20 |
| | ⋮ | ⋮ | ⋮ |
| FFF | F_FFFF | 0 | 10 |

FIG. 6A

| PST1 (RELATING TO IPA) | | | | | |
|---|---|---|---|---|---|
| PSA | TNIPA | IPAmax | ECmax | IPAmin | ECmin |
| 0 | 1000 | 255 | 150 | 81 | 120 |
| 1 | 3333 | 511 | 110 | 256 | 180 |
| 2 | 4444 | 63 | 160 | 32 | 130 |
| ⋮ | ⋮ | ⋮ | ⋮ | ⋮ | ⋮ |
| 4095 | 500 | 1023 | 120 | 512 | 90 |

FIG. 6B

| PST2 (RELATING TO VPA) | | | | | |
|---|---|---|---|---|---|
| PSA | TNVPA | VPAmax | ECmax | VPAmin | ECmin |
| 0 | N-1000 | 1000 | 50 | 1011 | 40 |
| 1 | N-3333 | 2000 | 10 | 2033 | 1 |
| 2 | N-4444 | 600 | 80 | 622 | 70 |
| ⋮ | ⋮ | ⋮ | ⋮ | ⋮ | ⋮ |
| 4095 | N-500 | 6000 | 30 | 6055 | 20 |

FIG. 7A

| NXPAT |||| 
|---|---|---|---|
| ENUM | NXPA [31:0] | NXVF  0: invalid  1: valid | NXEC |
| 0 | 0 | 0 | 0 |
| 1 | 1 | 0 | 0 |
| 2 | 2 | 0 | 0 |
| ⋮ | ⋮ | ⋮ | ⋮ |
| N-1 | N-1 | 0 | 0 |

FIG. 7B

| NXPAT |||| 
|---|---|---|---|
| ENUM | NXPA [31:0] | NXVF | NXEC |
| 0 | 1 | 0 | 100 |
| 1 | 0 | 0 | 101 |
| 2 | 5 | 0 | 102 |
| ⋮ | ⋮ | ⋮ | ⋮ |
| N-1 | 1023 | 0 | 110 |

FIG. 8A

| ATT | | |
|---|---|---|
| LA | PA (CPA) | VF (CVF) |
| 0 | 0 | 0 |
| 1 | 0 | 0 |
| 2 | 0 | 0 |
| ⋮ | ⋮ | ⋮ |
| 5 | 0 | 0 |
| ⋮ | ⋮ | ⋮ |
| 0xFFFF_FFFF | 0 | 0 |

0 : invalid
1 : valid

FIG. 8B

| NVM [NVM10~NVM17] | | | |
|---|---|---|---|
| PA | DATA | LA | DVF |
| 0 | 0 | 0 | 0 |
| 1 | 0 | 0 | 0 |
| 2 | 0 | 0 | 0 |
| 3 | 0 | 0 | 0 |
| ⋮ | ⋮ | ⋮ | ⋮ |
| 9 | 0 | 0 | 0 |
| ⋮ | ⋮ | ⋮ | ⋮ |
| 0xFFFF_FFFF | 0 | 0 | 0 |
| 0x1_0000_0000 | 0 | 0 | 0 |
| ⋮ | ⋮ | ⋮ | ⋮ |
| 0x1_0000_FFFF | 0 | 0 | 0 | y # SEMICONDUCTOR DEVICE AND METHOD OF CONTROLLING NON-VOLATILE MEMORY DEVICE

CROSS-REFERENCE TO RELATED APPLICATION

The present application is a Continuation of U.S. Nonprovisional patent application Ser. No. 13/443,883 filed on Apr. 10, 2012, which claims priority to Japanese Patent Application No. JP 2011-88032 filed on Apr. 12, 2011, the content of which is hereby incorporated by reference into this application.

TECHNICAL FIELD OF THE INVENTION

The present invention relates to the techniques for semiconductor devices such as semiconductor memories and ICs and particularly relates to the techniques effectively applied to a device (memory module) made up of non-volatile memory devices and a control circuit device and a method of controlling the non-volatile memory devices by the control circuit device in an information processing system thereof.

BACKGROUND OF THE INVENTION

Examples of non-volatile memory devices include a NAND-type flash memory (SSD or the like) and a resistance-change-type non-volatile memory (phase-change memories, ReRAM, or the like).

[(1) NAND-Type Flash Memory]

The NAND-type flash memory is utilized in a storage device such as SSD (Solid State Drive) and a memory card. The SSD made up of a plurality of NAND-type flash memories and a controller is utilized in, for example, server equipment, a laptop PC, or a netbook (notebook PC).

A NAND-type flash memory is described in, for example, Data Sheet of NAND-type flash (TC58NVG2S3ETA00) (Non-Patent Document 4). The NAND-type flash memory shown in Non-Patent Document 4 has an upper limit for an erase count, and the size of data write and the size of data erase are largely different from each other.

A method of controlling a NAND-type flash memory is disclosed in, for example, Japanese Unexamined Patent Application Publication No. 2008-146255, Japanese Unexamined Patent Application Publication No. 07-153285, Japanese Unexamined Patent Application Publication No. 2002-533810, and Japanese Unexamined Patent Application Publication No. 2004-240572 (Patent Documents 1, 2, 3, and 4).

The characteristics of the NAND-type flash memories are, for example: (1) the erase count of a memory region has an upper limit, (2) the size of data write ("page") and the size of data erase ("block") are largely different from each other, and (3) overwrite cannot be carried out (operation of collective write after read and erase are once carried out is required). Particularly, above-described (1) relates to the problem of the life of the device, and above-described (2) and (3) relate to the problem of inefficiency (processing efficiency) of, for example, data write.

[(2) Resistance-Change-Type Non-Volatile Memory (Phase-Change Memory or the Like)]

As the resistance-change-type non-volatile memory, a phase-change memory, a resistance-change memory (ReRAM: Resistive RAM), and others have been developed.

The characteristics of the phase-change memories are, for example: (1) the write count of a memory region has an upper limit, (2) the size of data write and the size of data erase are the same and small, (3) overwrite can be carried out, and (4) the resistance value of a memory cell (element) after data write may be varied. Particularly, above-described (1) relates to the problem of the life of the device, above-described (2) and (3) relate to the problem of efficiency (processing efficiency) of, for example, data write, and above-described (4) relates to the problem of instability (reliability) of, for example, data read.

As a data erasing operation in the phase-change memory, for example, as shown in FIG. 16, a reset pulse (1601) is uniformly applied to a target memory region from a control circuit, thereby equalizing the values of the target memory cells (resistance values) (for example, to storage information '1').

Furthermore, as the techniques studied by the inventor of the present invention, for example, the following techniques are conceivable in a semiconductor device including the phase-change memory.

A storage element uses a chalcogenide material (or a phase-change material) such as Ge—Sb—Te based material or Ag—In—Sb—Te based material containing at least antimony (Sb) and tellurium (Te) as a material of a recording layer. A diode is used for a selective element. The characteristics of a phase-change memory (memory cell) using a chalcogenide material and a diode in this manner are described in, for example, IEEE International Solid-State Circuits Conference, Digest of Technical Papers, US, 2007, pp. 472-473 (Non-Patent Document 1).

As an example of conventional techniques, FIG. 16 shows the relation between the pulse width and temperature required for phase change in a resistive storage element (phase-change memory cell) using a phase-change material. When storage information '0' is to be written to this storage element, a reset pulse (1601) that heats the element to a melting point Ta of the chalcogenide material or higher and then rapidly cools the element is applied. By setting the cooling time t1 to be short, for example, about 1 ns, the chalcogenide material is brought to a high-resistance amorphous (non-crystalline) state. Reversely, when storage information '1' is to be written, by applying a set pulse (1602) that keeps the storage element within a temperature range lower than the melting point Ta and higher than a crystallization temperature Tx, which is equal to or higher than the glass-transition point, the chalcogenide material is brought to a low-resistance polycrystalline state. The time t2 required for crystallization is different depending on the composition of the chalcogenide material. The temperatures of the element shown in FIG. 16 depend on the Joule heat generated by the storage element itself and the heat diffusion to the surrounding area.

As described in IEEE International Electron Devices meeting, TECHNICAL DIGEST, US, 2001, pp. 803-806 (Non-Patent Document 2), in a phase-change memory, if a resistive element structure becomes small, the electric power required for changing the state of a phase-change film becomes small. Therefore, in principle, this is suitable for miniaturization and has been actively studied.

IEEE JOURNAL OF SOLID-STATE CIRCUIT, VOL. 40, No. 1, JANUARY 2005, US, 2005, pp. 293-300 (Non-Patent Document 3) describes a phase-change memory that requires the time of about 120 ns for reducing the resistance of a chalcogenide material and the time of about 50 ns for increasing the resistance thereof.

SUMMARY OF THE INVENTION

As described above, any of the non-volatile storage devices such as the NAND-type flash memory and resistance-changetype non-volatile memory (phase-change memory) has problematic points and room for improvement in terms of life, reliability, processing efficiency, and others in addition to advantages thereof.

The inventor of the present invention has studied about (1) a NAND-type flash memory (control method thereof and the like) and (2) a resistance-change-type non-volatile memory (characteristics of the resistance value of a phase-change memory using a recording layer made of a chalcogenide material and a diode) as described below.

[(1) Study of NAND-Type Flash Memory]

For example, a 4-Gbit NAND-type flash memory (for example, Non-Patent Document 4) is composed of a chip including a page of 2048+64=2112 bytes, a block composed of 64 pages (131072+4096=135168 bytes), and 4096 blocks.

A SSD is made up of a plurality of NAND-type flash memories and a controller (flash controller) which controls these flash memories. A host controller (information processing device) and the SSD (flash controller) are connected to each other with a SATA interface. A data write operation to a memory (NAND-type flash memory) in the case in which a command to write the data corresponding to one page is issued from the host controller to the SSD will be described below.

The above-described data write to the memory is carried out in a unit of page. In the data write, the controller has to carry out the operation of once reading the data corresponding to one block (135168 bytes) from the memory, erasing the data corresponding to one block, and then writing new data corresponding to one page (2112 bytes) In other words, the above-described data write is realized by [block reading operation]+[block erasing operation]+[page writing operation].

The above-described NAND-type flash memory has the maximum erasable number of times (referred to as EMAX), and if this maximum erasable number of times EMAX is exceeded, the data saved in the memory is not ensured. In other words, the SSD or the like utilizing the memory comes to the end of life. Therefore, in order to extend the life of the SSD or the like, an efficient data erasing method (system including control of data erase) is required.

However, in the above-described memory, the data writing unit (page) and the data erasing unit (block) are largely different from each other as described above, and even when the data corresponding to, for example, one page (2112 bytes) is to be written, the amount corresponding to one block (135168 bytes) having a data size 64 times as large as that has to be erased. Thus, it has been found out that the processing operation including data erase is extremely inefficient and it is difficult to improve the life of the SSD or the like utilizing the memory.

Furthermore, it has been found out that when the above-described data corresponding to one page (2112 bytes) is to be written, the data corresponding to one block has to be read before erasing the data corresponding one block (135168 bytes), and writing performance is deteriorated.

[(2) Study of Resistance-Change-Type Non-Volatile Memory (Phase-Change Memory or the Like)]

As described above, a memory such as a phase-change memory which is a resistance-change-type non-volatile memory is capable of carrying out overwrite of data although the memory has an upper limit value for the number of times of data write, and the minimum unit thereof is as small as one byte. In other words, it has been found out that only the amount of a required data size can be rewritten.

Therefore, one of the objects of the present invention is to use the characteristics (advantages) of a resistance-change-type non-volatile memory such as the above-described phase-change memory to extend the life of a memory module (device) made up of the memory and a control circuit thereof.

Furthermore, the contents particularly studied about the phase-change memory will be described below. In the data write to the phase-change memory, the resistance value of a phase-change memory cell is controlled by controlling the Joule heat generated by current. It has been found out that there is a problem that the resistance values after normal rewriting operation are varied due to the differences in the electric characteristics of memory cells caused due to the thermal history by the Joule heat. Moreover, it has been found out that, in the case in which the memory cells are to be overwritten with data, the resistance values thereof are varied due to the differences in the state after rewrite, and therefore, resistance variations among the memory cells are increased, and characteristics are largely affected.

Therefore, one of the objects of the present invention is to achieve the long life and high reliability in relation to a memory module (device) made up of a memory such as the above-described phase-change memory and a control circuit thereof by managing a method of, for example, data write from the control circuit to the memory.

In view of the above-described studies, a main object of the present invention is to provide the techniques capable of realizing the long life and high reliability in relation to a semiconductor device or the like including a memory.

In order to achieve the above-described objects, a typical mode of the present invention is, for example, a memory module (semiconductor device) made up of a memory device and a control circuit (controller) and is characterized by having the configuration shown below.

A semiconductor device of the mode is a semiconductor device comprising: a non-volatile memory device; and a control circuit device that carries out access to the non-volatile memory device, the non-volatile memory device has an overwritable characteristic, the control circuit device carries out control by using predetermined management information so as to equalize sizes of data write and data erase with respect to an address region of the non-volatile memory device, the control circuit device carries out, with respect to a data write request from outside including a first-type address and write data, control of allocating a sequential second-type address of the non-volatile memory device to the first-type address independently from the first-type address, and when the request is an overwrite request to write data of a first region corresponding to the second-type address allocated to the first-type address, without carrying out a data overwriting operation, the control circuit device realizes the data write by a set of two types of operations including: (a) an erasing operation of the write data of the first region or an invalidating operation of setting a flag value of the first region to an invalid state; and (b) a writing operation of the write data to the second-type address corresponding to a second region allocated differently from the first region or a validating operation of setting a flag value of the second region to a valid state.

According to the typical mode of the present invention, long life, high reliability, and others can be realized in relation to a semiconductor device including a memory and others.

(1) Particularly, the long life of a non-volatile memory device can be realized by a mechanism that suppresses and smoothes variations in the data erase counts of the regions of the non-volatile memory device and others.

(2) Particularly, reading processing performance can be improved and high reliability can be realized by a mechanism that realizes data write by [erase]+[writing operation] without carrying out overwrite even if the non-volatile memory device has an overwritable system and suppresses (uniformizes) variations in the state (resistance value) of resistance-change-type memory cells.

(3) Particularly, the long life and high reliability can be realized by a mechanism that sequentially allocates physical addresses of the non-volatile memory device to logical addresses, which are from an information processing device (host), and uses the allocated addresses to suppress and smooth the variations in the data erase counts of each region of the physical address of the memory.

(4) Particularly, further higher performance can be realized by a mechanism that carries out pipeline processes in data write.

BRIEF DESCRIPTIONS OF THE DRAWINGS

FIG. 5 is a drawing showing a configuration example of a physical address table (PAT);

FIG. 6A is a drawing showing a physical segment table (PST1) relating to invalid physical addresses (IPA);

FIG. 6B is a drawing showing a physical segment table (PST2) relating to valid physical addresses (VPA);

FIG. 7A is a drawing showing a configuration example of a write physical address table (NXPAT) in an initial state;

FIG. 7B is a drawing showing a configuration example of the write physical address table (NXPAT) in an updated state;

FIG. 8A is a drawing showing a configuration example of an address conversion table (ATT) particularly in an initial state;

FIG. 8B is a drawing showing a configuration example of storage information of the non-volatile memory devices (NVM) particularly in an initial state;

Figure 15:
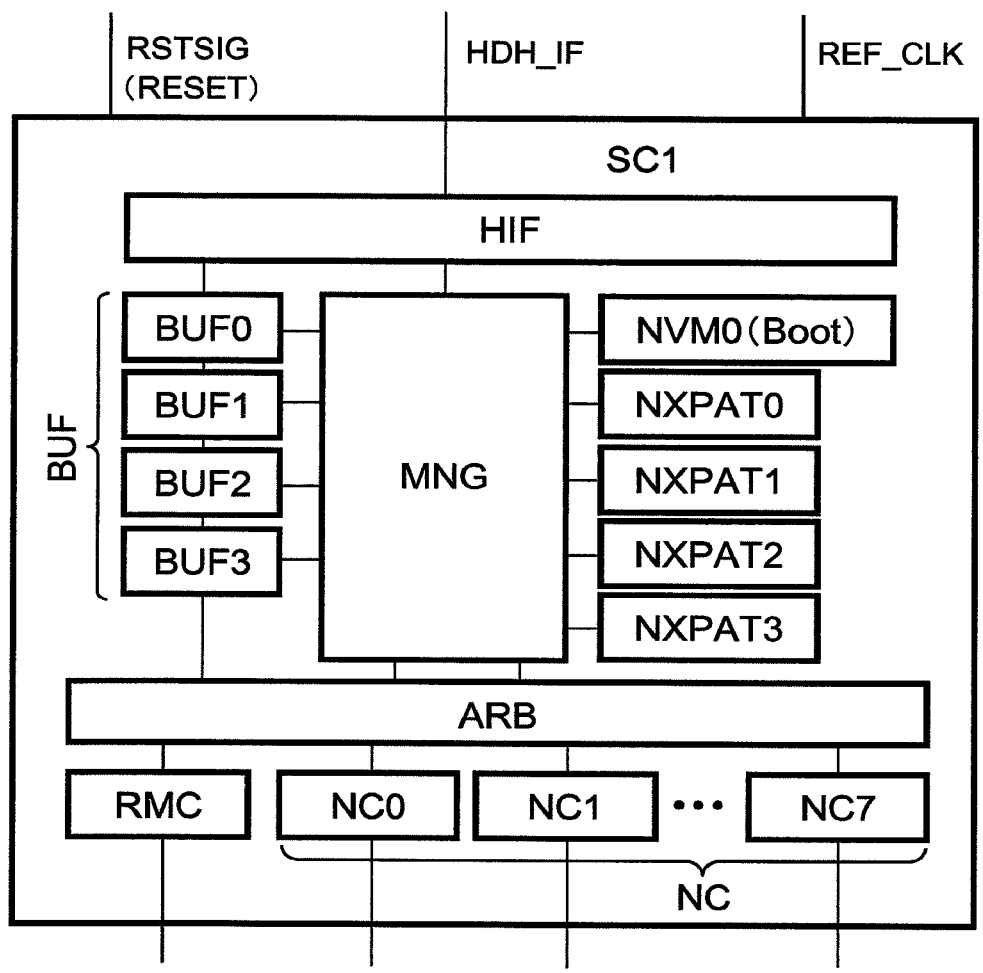
Figure 16:
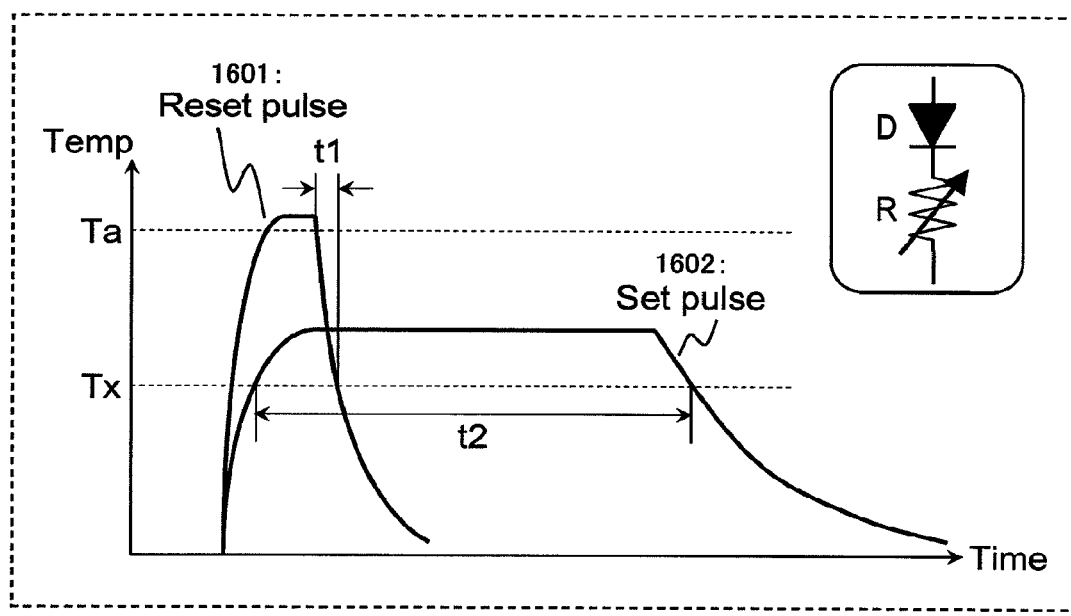

FIG. 15 is a configuration diagram showing a configuration example of a control circuit of a memory module in a system of a fourth embodiment of the present invention; and FIG. 16 is a drawing showing the characteristics (relation between the pulse width and temperature required for phase change) in a resistive element (phase-change memory cell) using a phase-change material as an example of conventional techniques.

DESCRIPTIONS OF THE PREFERRED EMBODIMENTS

Hereinafter, non-volatile memory devices, a memory module (semiconductor device) including the non-volatile memory devices and a control circuit, an information processing system including the memory module and an information processing device, a controlling method relating to data write to the non-volatile memory devices in the device and system and others will be described as embodiments of the present invention with reference to FIG. 1 to FIG. 16.

<Characteristics>

The present invention and the embodiments have the configuration including the following characteristic elements.

(A) Basic System (Data Writing System)

The semiconductor device (memory module) employs a following system (configuration) in relation to the control of processing operations including data write from a control circuit to a memory device (non-volatile memory device). As the memory device, for example, a resistance-change-type non-volatile storage device such as a phase-change memory is employed. In this case, the device has the above-described characteristics {(1) the upper limit for the number of times of write, (2) the sizes of write and erase are mutually the same, (3) overwritable, (4) variation in the resistance values of write memory cells, and others}. The control circuit receives requests/instructions of data write or read from an information processing device (host) and controls the processing operations of data write and read with respect to the memory device.

In this system, even if a data overwrite request is given (even if the memory device has an overwritable format) in the data write from the control circuit to the memory device, a data overwriting operation is not carried out, and data write is realized by a set of two types of operations such as (a) [erasing operation/invalidating operation] with respect to a first region/address and (b) [writing operation/validating operation] with respect to a second region/address as described below. More specifically, in (a) [erasing operation/invalidating operation], an operation of once setting the state of a memory cell of the data of the corresponding first region/address of the memory device to an amorphous or crystalline state ("erasing operation") or an operation of setting a flag value corresponding to the state (erase state) ("invalidating operation") is carried out. In addition, in (b) [writing operation/validating operation], an operation of writing write data to the memory cell of a second region/address which is different from the above-described first region/address ("writing operation") or an operation of setting a flag value corresponding to the state (write state) ("validating operation") is carried out.

For example, the "erasing operation". is the operation of resetting the information bits (resistance values) of memory cells to the same value, the "invalidating operation" is the operation of changing the flag value corresponding to the first region/address to 0, the "writing operation" is the operation of setting the information bits of the memory cell to 0 or 1 in accordance with the write data, and the "validating operation" is the operation of changing the flag value corresponding to the second region/address to 1.

(B) Unit and Size

The control circuit and others carry out management of address information by the unit of a predetermined size so that the size of the data erasing unit in the above-described (a) [erasing operation] and the size of the data writing unit in the above-described (b) [writing operation] are equal to each other, and control the data erase, write, and others with respect to the memory device by the unit. As the above-described units, the control circuit carries out management of the address information of each unit, for example, the unit of physical address region (sector) of the memory device and the unit (physical segment) by the gathering of a plurality of sequential physical address regions (sectors) (for example, physical address table and physical segment table).

(C) Flag Information

The control circuit and others carry out information management for the above-described operations of (a) and (b). For every region of a unit such as a physical address in the memory device, the control circuit carries out management of flag information, which represents the valid/invalid state of the region and the data stored therein. Then, in the above-described operation of (a)+(b), for example, if the corresponding data of a first region is erased/invalidated in the operation (a), the control circuit changes the corresponding flag value to 0, and if write data is written to a second region in the operation (b), it changes the corresponding flag value to 1.

(D) Count Information

The control circuit and others carry out information management of the erase count (or write count) of data for each region of a unit such as a physical address in all the memory regions. For example, the erase count is incremented at every execution of the above-described (a) [erasing operation]. Alternatively, the write count is incremented at every execution of the (b) [writing operation]. Note that, since (a) and (b) correspond to each other as a set, the concept of the erase count and the concept of the write count correspond to each other.

(E) First Table

The control circuit and others select (determine) an address/region to be the target (destination) to which data is to be written next by using the information of the above-described count and flag so as to suppress and smooth variation in the usage (erase or write) in all the memory regions. The control circuit carries out management of the address information (for example, physical address information) for selecting the above-described write destination (for example, first table: write physical address table). The information of the above-described count and flag is managed in association with every address/region. Particularly, the processing speed is increased by providing the first table in the control circuit.

For example, in preparation for a data write request in the future, the control circuit registers information such as candidates of the address of the next write destination or a plurality of physical addresses to be used preferentially to the first table in advance and updates the information as needed. For example, when the address information is registered to the above-described first table, the control circuit preferentially registers, for example, the physical address at which the above-described count for each address/region is small and the above-described flag value is 0 (invalid). For example, the control circuit compares a value such as the erase count with a predetermined threshold value, and registers the address/region having the value smaller than the threshold value. For example, the addresses of the physical segment (corresponding physical addresses) having the minimum erase count are registered.

In the next data write, the control circuit references the information of the first table and particularly selects (determines) the address whose count is small and flag value is 0 (invalid) so as to allocate and use the selected address as the address (second region/address) of the next write destination. In this manner, variations in the usage (erase and write) of the whole memory regions are suppressed and smoothed. For example, with respect to a plurality of data write requests, the control circuit selects and uses a plurality of addresses in a descending order (priority order) from the information of the plurality of addresses registered in the first table.

(F) Sequential Address Allocation

The control circuit carries out information management and control so as to write data to sequential addresses (for example, physical addresses) in a memory region. When the control circuit selects (determines) the address/region of the above-described next data write destination and carries out (a) the [erasing operation] of the first region and (b) the [writing operation] of the second region, for example, the control circuit sequentially allocates and uses addresses in the order of the physical address values from among the plurality of physical addresses of the whole memory region. For example, when all of the physical address values are used from the beginning to the end, it returns to the initial physical address value to repeatedly use the address values in the same manner. Particularly, even in the case in which an unused second region is to be selected with respect to a used first region in the above-described set operation, addresses which are sequential in the first and second regions are used. For example, from the start of use of this device, the memory region is kept being used by the sequential addresses in the above-described manner. As described above, the use (erase and write) of the memory region is smoothed.

(G) Logical Address-Physical Address

The control circuit and others carry out information management (for example, address conversion table) of the correspondence relation (allocation) of a logical address in a request from an external information processing device (host) and a physical address of the memory device. Particularly, the size of physical address space is configured to be larger than the size of logical address space. For example, in the above-described (a) operation, only update (change from 1 to 0) of the flag value of the first region is carried out as the invalidating operation, and a data deleting process of the first region is carried out as the erasing operation later in terms of time.

(H) Various Tables

The control circuit retains and manages table information for above-described various types of information management in the memory device provided in the control circuit or in the memory device provided outside the control circuit and inside the memory module. For example, the control circuit retains a table for the management of information of the physical addresses, the physical segments, the flags, and the counts, a table for the management of the correspondence relation (conversion) of the logical addresses and the physical addresses, a first table for selecting the next write destination address, and others.

Also, the control circuit carries out management of information, which has the contents corresponding to the above-described table information retained on the control circuit side, by storing the information in the region of the memory device side, for example, in each region of a unit of a physical address or the like.

(I) Processing Example

With respect to a data write request (for example, including logical address, write data, size, and others) from the information processing device (host), the control circuit references the above-described management information (tables) to read the physical address, which is associated with (allocated to) the logical address, and information such as a flag and count, and then selects (determines) the physical address (second address/region), which is to be the write destination of the write data. For example, if it is a data write request (overwrite request) to the physical address (first region) of the memory device which is in a data stored state (flag value is 1 (valid)), the control circuit selects (determines), as a next write destination, a sequential physical address (second region), which is different from the above-described address and in a state in which data is newly writable (flag value is 0 (invalid)) from among the plurality of addresses of the first table. When the above-described next address (second region) is selected, the control circuit carries out (a) [erasing operation/invalidating operation] to the data of the above-described first region and also carries out (b) [writing operation/validating operation] of the write data to the above-described next address (second region).

(J) Pipeline Process

The control circuit carries out a pipeline process of: a first processing unit/operation in which a data write request and write data from the information processing device (host) are transferred (stored) to a predetermined buffer memory device provided in the control circuit (or outside the control circuit and inside the memory module); a second processing unit/operation in which a process of predetermined advance preparation (including at least determination of the address of the next write destination) for writing the above-described write data to the address of the next write destination of the memory device is carried out; and a third processing unit/operation in which the write data of the above-described buffer memory device is written to the address of the next write destination of the memory device.

In the above-described pipeline process, the (a) [erasing operation] and the (b) [writing operation] may be separately carried out in mutually different pipeline processing units.

(K) Configuration Example

The semiconductor device which is the memory module of the present invention (MM0) includes, for example, a control circuit device (SC0), a plurality of non-volatile memory devices (NVM), and a random access memory (RM). A first table which stores the address information of the next write destination is retained in the control circuit device (SC0). In the random access memory (RM), a second table which stores management information such as the physical addresses of the non-volatile memory device (NVM), management information of corresponding flags and counts, management information of the correspondence relation (conversion) between the logical address information of a data write request and the physical address information of the non-volatile memory device (NVM), and others is retained. The control circuit device (SC0) has an interface circuit with the information processing device (CC), an information processing circuit, a buffer memory device, a memory controlling circuit, and others.

(L) Second Smoothing Method

The control circuit obtains the difference between the maximum erase count of the physical addresses in the invalid state (0) and the minimum erase count of the physical addresses in the valid state (1). When the difference is larger than a predetermined threshold value, in order to reduce such a difference (in order to smooth the erase counts), the control circuit moves the data of the physical address having the maximum erase count relating to the physical address in the valid state (1) to the physical address of the maximum erase count relating to the physical address in the invalid state (0).

(M) Initialization

For example, at the start of use of the device or immediately after power-on (at the start-up), the control circuit initializes the contents of the tables of the management information stored in the control circuit and the random access memory and initializes the contents of the management information stored in the non-volatile memory device. Also, at the end of activation (immediately before power-off), the control circuit saves each table information in the non-volatile memory device. Further, at the activation, the control circuit reads and reproduces the table information saved in the non-volatile memory device and starts the control from the state continued from the previous time.

First Embodiment

An information processing system of the first embodiment will be described with reference to FIG. 1 to FIG. 11. The first embodiment has a configuration including a first smoothing method (dynamic smoothing method) relating to the data erasing operations (erase count (EC)) of each of physical addresses (PA) of a non-volatile memory device NVM (phase-change memory PM) The smoothing means the act of suppressing and smoothing variations in the data erasing operations of NVM regions.

[System]

Figure 1:
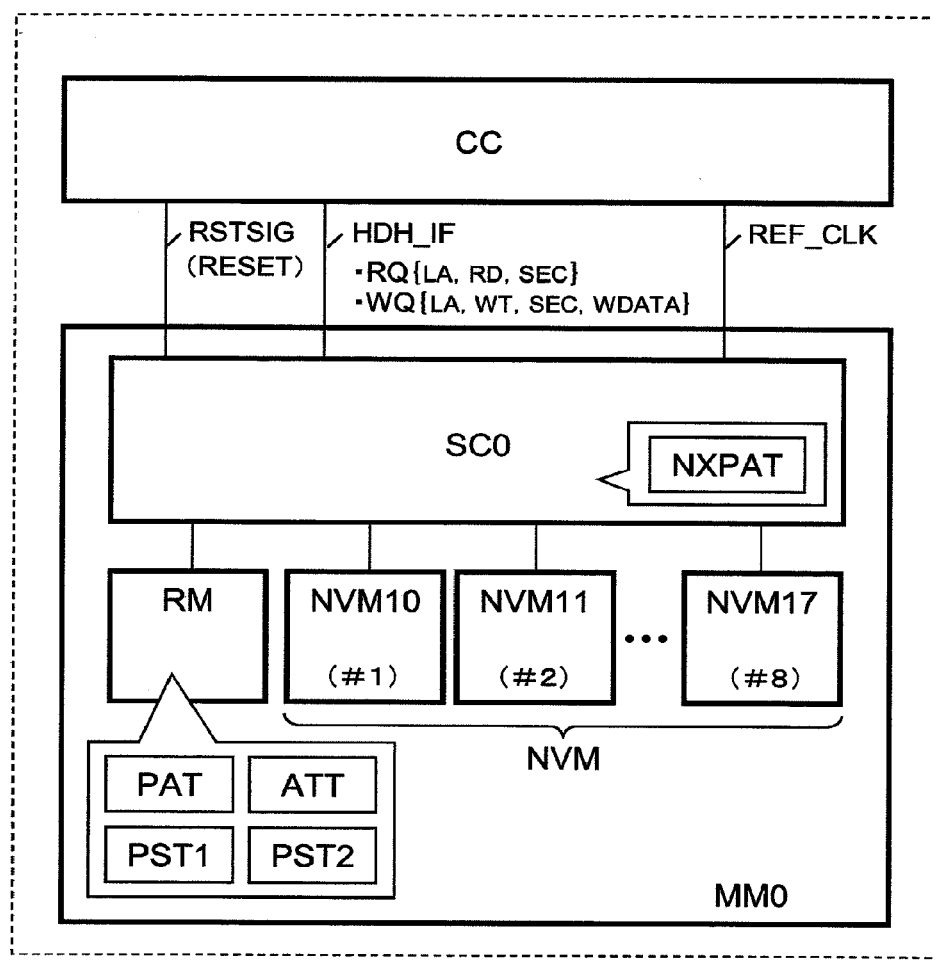
FIG. 1 is a drawing showing a configuration example of a system (information processing system including a memory module having non-volatile memory devices and an information processing device) of a first embodiment of the present invention.

FIG. 1 shows a block configuration example of the information processing system of the first embodiment. This information processing system has the configuration in which an information processing device CC and a memory module MM0 are connected to each other. In the present embodiment, the information processing device CC is a host controller (for example, CPU chip), which carries out management of the data read, written, and saved from/to the memory module MM0 by logical addresses LA having a minimum unit of 512 bytes. The memory module MM0 is a semiconductor device, which is a non-volatile storage device.

The information processing device CC carries out read and write of data with respect to the memory module MM0 through interface signals HDH_IF. Read requests RQ, write requests WQ, and the like in which clock information is embedded and which has been converted to serial data are input from the information processing device CC to the memory module MM0 through the interface signals HDH_IF. The signal system that connects the information processing device CC and the memory module MM0 to each other is, for example, a serial interface signal system, a parallel interface signal system, or an optical interface signal system, and all of the systems can be applied. Also, the clock system that operates the information processing device CC and the memory module MM0 is, for example, a common clock system, a source synchronous clock system, or an embedded clock system, and all of the clock systems can be applied. In the present embodiment, operation examples using the embedded clock system and the serial interface signal system will be described.

The read request RQ includes a logical address (value) LA, a data read command RD, a sector count SEC, and others, and the write request WQ includes a logical address (value) LA, a data write command WT, a sector count SEC, write data WDATA, and others.

The memory module MM0 has the configuration including a plurality of (eight in this example) non-volatile memory devices NVM {NVM10 to NVM17}, a random access memory RM, and a control circuit SC0 which controls these memories. The control circuit SC0 can be also referred to as, for example, a storage controller.

The non-volatile memory device NVM of the present embodiment employs a phase-change memory PM (FIG. 3) described later. The plurality of (eight) non-volatile memory devices NVM10 (#1) to NVM17 (#8) have the same configuration and performance in this example.

A write physical address table NXPAT (FIG. 7) described later and others are stored in the control circuit SC0. Also, a physical address table PAT (FIG. 5), a physical segment tables PST {PST1, PST2} (FIG. 6), an address conversion table ATT (FIG. 8) described later, and others are stored in the random access memory RM. Since the tables of various types of management information are provided in the control circuit SC0 and the random access memory RM, efficiency of processes such as address determination can be improved.

[Control Circuit]

Figure 2:
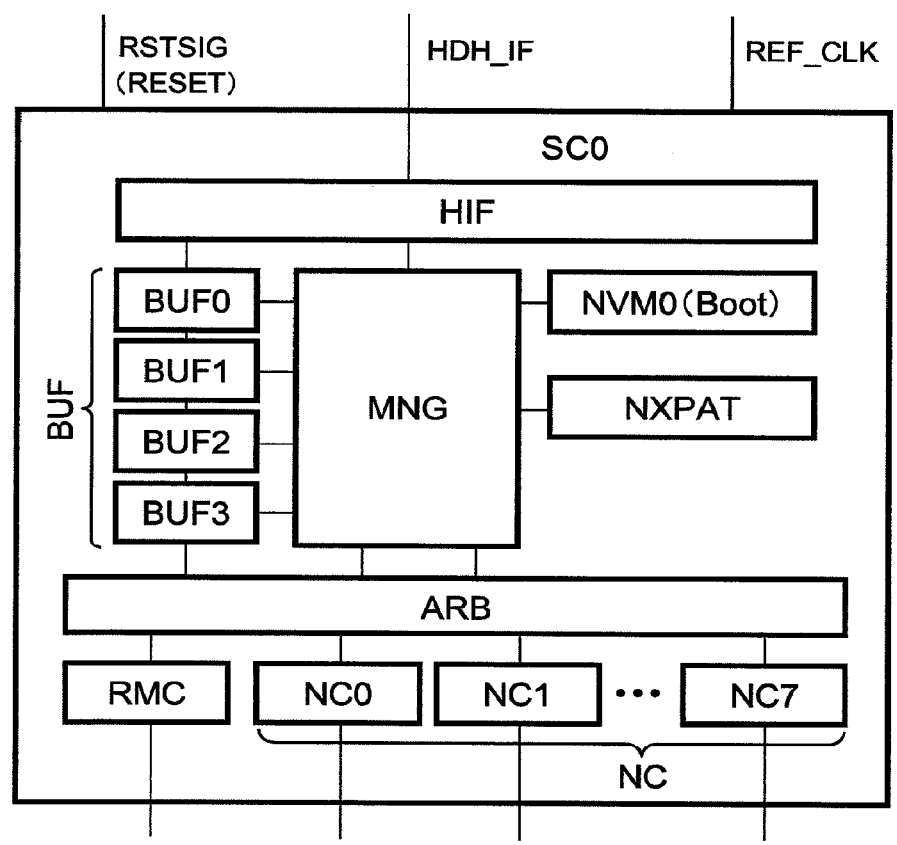
FIG. 2 is a drawing showing a configuration example of a control circuit (SC0) of FIG. 1.

FIG. 2 shows a configuration example of the control circuit SC0. The control circuit SC0 has the configuration including an interface circuit HIF, buffers BUF {BUF0 to BUF3} (buffer memory devices), a booting non-volatile memory device NVM0, a write physical address table NXPAT, an arbitration circuit ARB, an information processing circuit MNG, memory controlling devices NC {NC0 to NC7} which directly control NVM {NVM10 to NVM17}, respectively, and a memory controlling device RMC which directly controls the random access memory RM. In the configuration example of FIG. 2, the plurality of (four) buffers BUF {BUF0 to BUF3} are provided.

The information processing circuit MNG carries out management of the write physical address table NXPAT in the control circuit SC0 and also carries out management of the physical address table PAT, the physical segment tables PST, the address conversion table ATT, and others in the random access memory RM.

[Non-Volatile Memory Device NVM (Phase-Change Memory PM)]

Figure 3:
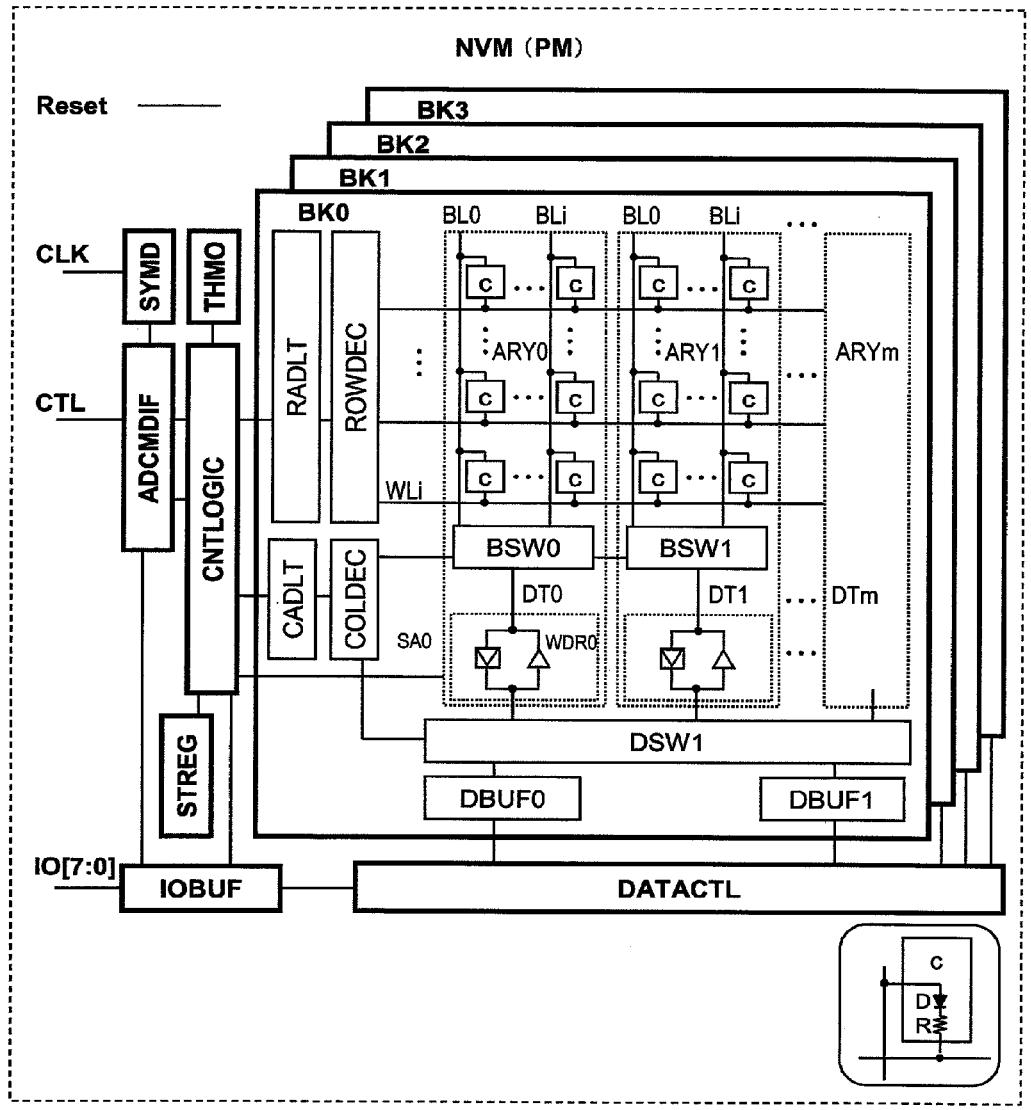
FIG. 3 is a drawing showing a circuit configuration example of a phase-change memory (PM) serving as the non-volatile memory device (NVM) of FIG. 1.

FIG. 3 shows a block configuration example of the phase-change memory PM, which is an example used as the non-volatile memory device NVM {NVM10 to NVM17} of FIG. 1 in the present embodiment. The phase-change memory PM has a configuration including a clock generating circuit SYMD, a status register STREG, an address/command interface circuit ADCMDIF, an input/output buffer IOBUF, a control circuit CNTLOGIC, a temperature sensor THMO, a data controlling circuit DATACTL, a plurality of memory banks BK {BK0 to BK3}, and others. Each of the memory banks BK has a configuration including a plurality of memory arrays ARY {ARY0 to m}, a row address latch RADLT, a column address latch CADLT, a row decoder ROWDEC, a column decoder COLDEC, a data selecting circuit DSW1, data buffers DBUF0 and DBUF1, and others. Each of the memory arrays ARY has a configuration including a plurality of memory cells c (phase-change-type memory elements), bit-line selecting circuits BSW, sense amplifiers SA, write drivers WDR, and others.

Control signals CTL input to the address/command interface circuit ADCMDIF include such signals as command latch enable signals CLE, chip enable signals CEB, address latch signals ALE, write enable signals WEB, read enable signals REB, ready/busy signals RBB, and others. As the input/output signals (IO signals) (8 bits) input to the input/output buffer IOBUF, command, address, and write data are input, and read data is output.

The circuit elements constituting each block in the present embodiment are formed on one semiconductor substrate such as single-crystal silicon by, for example, publicly-known integrated circuit techniques of CMOS (complementary MOS transistor). Furthermore, like the above-described phase-change memory PM, a resistive storage element is used as the memory cell (ReRAM or the like may be used) (the characteristics thereof are similar to those of FIG. 16). The non-volatile memory device NVM is not limited to the above-described phase-change memory PM, and other type of memory device having the characteristics similar to those described above can be applied.

[Initial Sequence]

Figure 4:
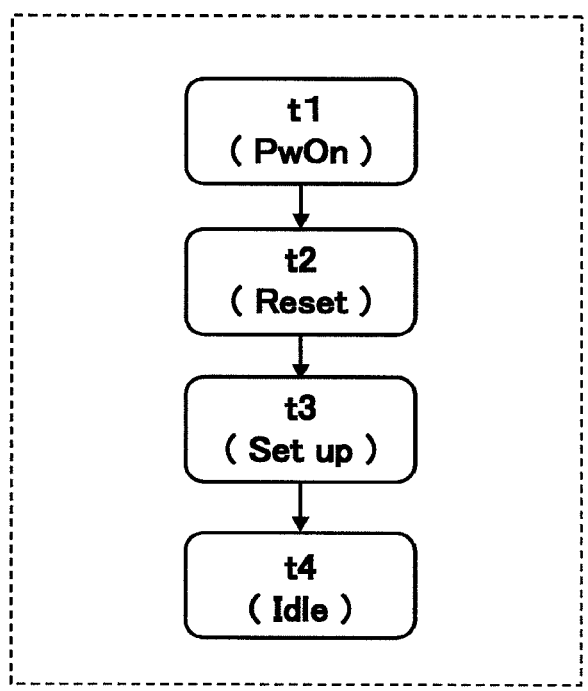
FIG. 4 is a drawing showing an example of an initial sequence at the power-on of the present system (memory module)

FIG. 4 shows an initial sequence example at the power-on (on) of the information processing system (FIG. 1). In a period t1 (PwOn), power is turned on to the information processing device CC and the non-volatile memory devices NVM {NVM10 to NVM17}, the random access memory RM, and the control circuit SC0 in the memory module MM0.

In a period t2 (Reset), the information processing device CC, the control circuit SC0, the non-volatile memory devices NVM {NVM10 to NVM17}, and the random access memory RM and the internal state thereof are reset (initialized). The method of this resetting is not particularly limited, but may be a method in which the reset is automatically carried out by respective built-in circuits, a method in which a reset terminal is provided outside to carry out a resetting operation by reset signals (FIG. 1, RSTSIG, RESET) thereof, or a method in which the reset is carried out by inputting a reset command from the information processing device CC to the control circuit SC0 through the interface signal HDH_IF.

The control circuit SC0 initializes the address conversion table ATT, the physical segment tables PST1 and PST2, and the physical address table PAT stored in the random access memory RM (FIG. 1), and furthermore, initializes the nonvolatile memory devices NVM (storage information) and the write physical address table NXPAT.

In a period t3 (Setup) after the end of the period t2, the information processing device CC reads a boot program stored in the booting non-volatile memory NVM0 in the control circuit SC0 and starts up the information processing device CC.

In a period t4 (Idle) after the end of the period t3 and thereafter, the memory module MM0 becomes an idle state to wait for the requests from the information processing device CC.

For example, at the start of use of the device or immediately after power-on (at the start-up), the control circuit SC0 initializes the contents of the tables (PAT, PST, ATT) like in t1 and t2 described above, and furthermore, initializes the storage information in the non-volatile memory devices NVM and the contents of the write physical address table NXPAT in the control circuit SC0. In the initialization process, for example in the case of start of device use, 0 is set as the values as shown in FIG. 7A, FIG. 8, and others.

Moreover, at the end of activation (immediately before power-off), the control circuit SC0 saves above-described table information in the non-volatile memory devices NVM. Also, at the activation, the control circuit SC0 reads and reproduces the table information saved in NVM and starts control from the state continued from the previous time.

[Physical Address Table PAT]

FIG. 5 shows a configuration example of the physical address table PAT stored in RM. PAT has a configuration including physical addresses PA (PA [31:0]) and valid flags VF and erase counts EC corresponding to the physical addresses PA. In the present embodiment, the physical addresses PA (PA [31:0]) (32 bits) are configured to have physical segment addresses PSA (PA [31:20]) of higher 12 bits and physical addresses (PA [19:0]) of lower 20 bits (referred to as PPA for distinguishment from PA of 32 bits).

The value of the valid flag VF is 0 or 1. Here, 0 represents "invalid" (invalid state), and 1 represents "valid" (valid state). The invalidity (0) can also be associated with the meaning of "address unallocated", "next write usable" (data erasable), initial state, and others. The validity (1) can also be associated with the meaning of "address allocated", "next write unusable" (data not erasable), and others. The act of changing 0 to 1 is defined as "validating", and the act of changing from 1 to 0 is defined as "invalidating".

In the present embodiment, management is carried out so that the physical address PA of the valid flag VF=0 (invalid) serves as an invalid physical address IPA and the physical address PA of VF=1 (valid) serves as a valid physical address VPA.

The erase count EC (Erase Count) represents the number of times of the data erasing operation which has been carried out by that time in unit of the region of a corresponding physical address PA (or the number of times of the corresponding data write operation which has been carried out). For example, the erase count EC is cumulatively incremented at every data erasing operation by the control circuit SC0 from EC=0 at the start of use of NVM.

[Physical Segment Table PST]

FIG. 6 shows configuration examples of physical segment tables PST {PST1, PST2} stored in RM. PST is a management table relating to the physical segment addresses PSA (FIG. 5), FIG. 6A shows the physical segment table PST1 relating to the invalid physical addresses IPA, and FIG. 6B shows the physical segment table PST2 relating to the valid physical addresses VPA.

In FIG. 6A, the physical segment table PST1 is configured to have the physical segment address PSA (PA [31:20]), a total number TNIPA of the invalid physical addresses IPA in the PSA, an invalid physical address IPAmax having a maximum erase count ECmax in the invalid physical addresses IPA in the PSA, the maximum erase count ECmax, an invalid physical address IPAmin having a minimum erase count ECmin in the invalid physical addresses IPA in the PSA, and the minimum erase count ECmin.

In FIG. 6B, the physical segment table PST2 is configured to have the physical segment address PSA (PA [31:20]), a total number TNVPA of the valid physical addresses VPA in the PSA, a valid physical address VPAmax having a maximum erase count ECmax in the valid physical addresses VPA in the PSA, the maximum erase count ECmax, a valid physical address VPAmin having a minimum erase count ECmin in the valid physical address VPA in the PSA, and the minimum erase count ECmin.

The erase count EC in a segment unit is also managed according to the total sum of the EC of the plurality of sectors. As shown in the example of TNVPA, the number of VPA (TNVPA) is obtained by subtracting the number of IPA (TNIPA) from N sectors (PA) constituting one segment.

[Unit/Size]

The configuration examples of various units and sizes used in the present embodiment will be summarized below. In the region of NVM (PM) of FIG. 1, "one physical address PA region" is equal to "1 sector", and is equal to "512 bytes". The region of one physical segment address PSA is a unit of sequential gathering of PA (sectors) corresponding to 20 bits (2048) and is one megabyte (2048×512 bytes). As shown in FIG. 5 and FIG. 6, the physical segment addresses PSA (0 to FFF) corresponding to 12 bits (4096) are provided, and the physical addresses PA (0 to F_FFFF) corresponding to 20 bits are provided.

In this system, the data sizes of (a) [erasing operation] and (b) [writing operation] are equal to each other and are, for example, in the unit of sector or segment (arbitrarily changeable). Also, units such as page and block of a NAND-type flash memory or the like are not used in this system. Units (names) such as sector and segment can also be referred to as other units (names) in accordance with the memory to be applied.

With respect to the space of a logical address LA (particularly, storage address) viewed from the information processing device CC (host), the space of the physical address PA of NVM of FIG. 1 is associated by using the address conversion table ATT. Particularly, the size of the PA space is configured to ensure allowance with respect to the size of the LA space. By virtue of this, the efficiency of the erasing operation and the like is improved by using the PA region corresponding to the allowance. For example, by setting VF=0 (invalid) in the PA region corresponding to the allowance, the erasing operation and the writing operation of data can be asynchronously carried out. For example, the PA region which has been previously invalidated (VF=0) can be subjected to a data erasing operation later.

[Write Physical Address Table NXPAT]

FIG. 7 shows the write physical address table NXPAT stored in the control circuit SC0. FIG. 7A shows an example of the initial setting of NXPAT at the start of use of device. FIG. 7B shows an example of an updated state of the contents of NXPAT. NXPAT is the table used in the writing of data to the non-volatile memory devices NVM {NVM10 to NVM17} for determining (selecting) the physical address PA (NXPA) of NVM to be used next. NXPAT corresponds to the registration of the information of a plurality of (N) sets of physical addresses PA (NXPA).

NXPAT is configured to have entry numbers ENUM, the physical addresses NXPA (32 bits), and valid flags NXVF and erase counts NXEC corresponding to the NXPA. The entry number ENUM represents the N value (0-th to N−1-th) in the plurality of (N) sets of NXPA, and the N value represents write priority (the number of registration). The addresses are preferentially used in the ascending order of the N value. The values based on the information of PAT of FIG. 5 are stored as NXPA, NXVF, and NXEC.

In the initial setting (for example, t1 of FIG. 4) of NXPAT of FIG. 7A, a location number 0 to a location number N−1 of the physical addresses NXPA are set in the order from ENUM=0 to N−1, respectively. Also, the valid flags NXVF and the erase counts NXEC corresponding to these physical addresses NXPA are all set to 0. Also in this case, the erase count NXEC at the start of use of device is set to 0 in the same manner as EC of PAT.

[Maximum Write Size, N Value]

In the present embodiment, aside from the data size of (b) [writing operation](for example, 1 sector=512 bytes), the maximum size which can be written at one time from the control circuit CS0 to the memory cell group of NVM ("maximum write size") is, for example, [the size of buffer per chip]×[the number of parallel chips] of NVM of FIG. 3=M× 512 bytes (sector). For example, M=16×8=128 (corresponding to 128 physical addresses PA). In order to support the configuration in which data write corresponding to M sectors can be carried out at one time in parallel in this manner, write physical address information corresponding to at least N=M is preferably registered/retained in the write physical address table NXPAT.

[Address Conversion Table ATT, NVM Information]

FIG. 8A shows a configuration example of the address conversion table ATT stored in RM. FIG. 8B shows the information stored on the non-volatile memory device NVM side so as to correspond to the contents of ATT of FIG. 8A. FIGS. 8A and 8B show examples of the initial setting state at the start of use of NVM. ATT is a table used for converting the logical addresses LA, which have been input (specified) from the information processing device CC to the control circuit SC0, to the physical addresses PA of the non-volatile memory devices NVM, and the corresponding relations between LA and PA are set therein.

The address conversion table ATT is configured to have the logical addresses LA, the physical addresses PA (current physical address CPA), valid flags VF of the PA (valid flag CVF corresponding to CPA), and others. The valid flag values VF (CVF) are similar to VF of FIG. 5. VF=0 (invalid) represents the state in which PA is not allocated to the LA (unallocated), and VF=1 (valid) represents the state in which the PA is allocated to the LA (allocated).

In the initial setting at the start of use of NVM (for example, t1 of FIG. 4), as shown in FIG. 8A, all PA of ATT and the valid flags VF of the PA are set to 0.

The information of the non-volatile memory devices NVM {NVM10 to NVM17} of FIG. 8B is configured to have the physical addresses PA, data DATA, the logical addresses LA, data valid flags DVF (DVF information storage region), and others. The information having the contents corresponding to those on the ATT side is stored as the NVM information. The above-described DATA is the region (data storage region) corresponding to PA. The above-described LA is an LA information storage region. The above-described DVF is the storage region of the DVF information corresponding to the PA and DATA. DVF on the NVM side has a correspondence relation with VF on the ATT side. Since management information is stored/managed in the non-volatile memory devices NVM, efficiency of processes such as address determination can be improved.

In the initial setting at the start of use of NVM (for example, t1 of FIG. 4), as shown in FIG. 8B, all DATA, all LA, and all DVF corresponding to all PA are set to 0 in the NVM information.

After the use of NVM is started, the information relating to data-written (stored) PA is saved in the table information when power is turned on.

[Write Request]

Examples of data write to the non-volatile memory device NVM in the case in which the write request WQ is input from the information processing device CC to the memory module MM0 through the interface signal HDH_IF will be described below.

In the sector count SEC contained in WQ, each one physical address PA region (=1 sector=512 bytes) corresponds to one count, and this is the information that specifies how many times the data write in the sector unit is to be repeated. For example, in the case of SEC=1, this represents data write having a size of 512 bytes.

As an operation example, if the write request WQ of SEC=1 is input N times (WQ#1 to WQ#N), the data (WDATA) contained in the respective write requests WQ is written to the N physical address PA regions (sectors) of NVM. PA used therefor is selected (determined) from the physical addresses NXPA registered in the write physical address table NXPAT. For example, write is carried out sequentially to the regions of the location number 0 to the location number N−1 of the N NXPA of NXPAT (FIG. 7A).

As another operation example, for example, if the write request WQ having SEC=16 (=8 Kbytes) is input one time, the data (WDATA) contained in the write request WQ is decomposed as the N (=16) write data each having 512 bytes for the physical address PA regions (sectors) of NVM and is then stored into the N (=16) PA regions (sectors). PA used therefor is selected from N NXPA of NXPAT, and write is carried out sequentially to the regions of, for example, the location number 0 to the location number N−1.

[Data Writing Process]

Figure 9:
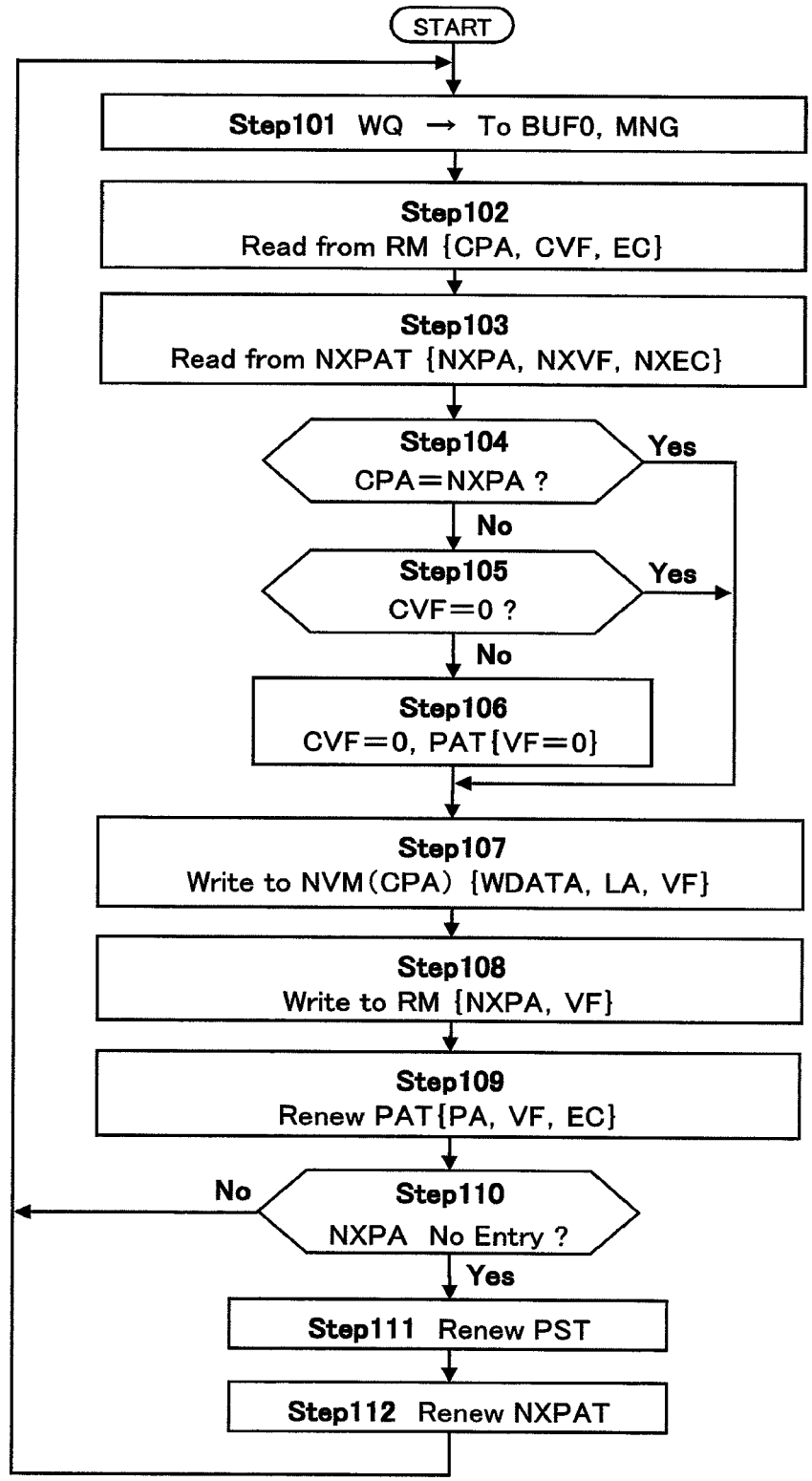
FIG. 9 is a drawing showing an example of a process flow of a data writing operation of the memory module.

FIG. 9 shows an example of the process flow of a data writing operation carried out by MM0 (SC0) when the write request WQ is input from the information processing device CC to the control circuit SC0 of the memory module MM0. In the present embodiment, the information processing circuit MNG in SC0 writes the write data (WDATA) into the plurality of (eight) NVM {NVM10 to NVM17}(memory regions) for each physical address PA region (sector) having the size of 512 bytes described above. For example, a write request WQ01 is assumed to contain a logical address value LA=0, a data write command WT, a sector count SEC=1, and write data WDATA (WDATA01) which is in the 512-byte unit. In FIG. 9, a part that mainly carries out the processes is SC0 (MNG). Also, FIG. 9 shows the example of the process in the case in which the number of the write physical address table NXPAT provided in the control circuit SC0 is one (FIG. 2).

(Step 101) When the write request WQ (WQ01) is input, the interface circuit HIF obtains the clock information embedded in WQ, converts WQ, which has been processed into serial data, to parallel data, and transfers the data to the buffer BUF0 and the information processing circuit MNG.

(Step 102) Then, the information processing circuit MNG decodes LA (=0), WT, and SEC (=1) of the above-described WQ (WQ01) and reads the information of the current physical address value CPA (=0) stored to correspond to the location number LA=0 in the information (ATT, PST, PAT) of the random access memory RM, the valid flag value VF (CVF) (for example, 0) corresponding to the value CPA (=0), and the information of the erase count value EC (for example, 500) thereof.

(Step 103) Then, SC0 (MNG) reads, from the write physical address table NXPAT, the write physical address NXPA (for example, NXPA=100) and the values of NXVF and NXEC corresponding to the NXPA by the amount corresponding to the number specified by the sector count SEC (for example, one) in the descending order of write priority, in other words, in the ascending order of the ENUM value.

(Step 104) Then, SC0 (MNG) compares the current physical address value CPA (for example: 0) of above-described Step 102 with the write physical address NXPA (for example: 100) of above-described step 103. If they are equal to each other (Yes), the process goes to Step 107, and if they are different from each other (No), the process goes to Step 105.

(Step 105) In the case of Step 105, SC0 (MNG) determines whether the valid flag value CVF corresponding to the current physical address value CPA (for example: 0) of Step 104 is 0 or not. The case of CVF=0 (Yes) represents that PA (CPA) (for example: 0) in NVM corresponding to the logical address LA (for example: 0) is invalid, and the process goes to Step 107 because this represents that only the new physical address PA (NEWPA) (for example: 100) is present as the PA corresponding to the LA (for example: 0). The "new physical address (PA)" is defined as NEWPA. The case of CVF=1 (No) described above represents that the physical address CPA (for example: 0) corresponding to the logical address LA (for example: 0) is valid (still valid), and therefore, the process goes to Step 106.

(Step 106) In Step 106, in order to write the write data WDATA01 to the new physical address PA (NEWPA) (for example: 100) of NVM corresponding to the above-described logical address LA (for example: 0), SC0 (MNG) changes the valid flag value CVF corresponding to the current physical address CPA (for example: 0) to 0 (invalid), and further correspondingly, changes the valid flag VF of the physical address CPA (for example: 0) in the physical address table PAT to 0 (invalid). After invalidating CPA corresponding to LA in Step 106 in this manner, the process goes to Step 107.

(Step 107) In Step 107, SC0 (MNG) writes the write data WDATA01 and the logical address value LA (for example: 0) and the valid flag value VF (NXVF) (for example: 1) corresponding to the NXPA to the region of the above-described physical address CPA=NXPA (for example: 100) in the non-volatile memory device NVM {NVM10 to NVM17}.

(Step 108) Subsequently, in Step 108, SC0 (MNG) writes the information of PA (NXPA) (for example: 100) and VF (CVF) (for example: 1) corresponding to LA (for example: 0) of NVM, which has been written in above-described Step 107, to the region of the logical address LA (for example: 0) of RM (ATT).

(Step 109) In next Step 109, MNG updates the contents of the physical address table PAT in RM. More specifically, MNG generates a new erase count value EC (NEWEC), which is obtained by increasing the erase count value NXEC corresponding to the physical address NXPA (for example: 100) by one, rewrites the erase count value EC corresponding to the physical address PA (for example: 100) in PAT in RM so that the erase count value EC becomes the above-described new erase count value NEWEC (in other words, increment of EC), and changes the valid flag VF of the PA to 1 (valid).

(Step 110) In Step 110, SC0 (MNG) determines whether the write (use) to all of the N physical addresses NXPA registered in the write physical address table NXPAT has been completed or not (whether there is any entry of NXPA to be the candidate of use next is present or not). Particularly, if the write to all NXPA of NXPAT has been completed (no entry) (Yes), the process goes to Step 111, and if uncompleted (with entry) (No), the process returns to the beginning to wait for the write request WQ from the information processing device CC to the memory module MM0.

(Step 111) In Step 111, at the point when the write of all NXPA of NXPAT described above is completed, MNG obtains the information relating to the physical segment address PSA (corresponding plural PA) in the physical segment table PST by using the information of the valid flag VF and the erase count EC of PA of the physical address table PAT and updates the physical segment table PST1 relating to the invalid physical addresses IPA. In other words, MNG obtains the values of TNIPA, IPAmax, ECmax, IPAmin, and ECmin described above in the PSA in PST1 and updates PST1. Also, MNG obtains the values of TNVPA, VPAmax, ECmax, VPAmin, and ECmin described above in the PSA in the physical segment table PST2 relating to the valid physical addresses VPA and updates PST2 in the same manner as that described above.

(Step 112) In step 112, MNG further updates the contents of the write physical address table NXPAT (described later, FIG. 10 and others). When the update of NXPAT in Step 112 is finished, the process returns to the beginning to wait for the write request WQ from the information processing device CC to the memory module MO.

[NXPAT Updating Process]

Figure 10:
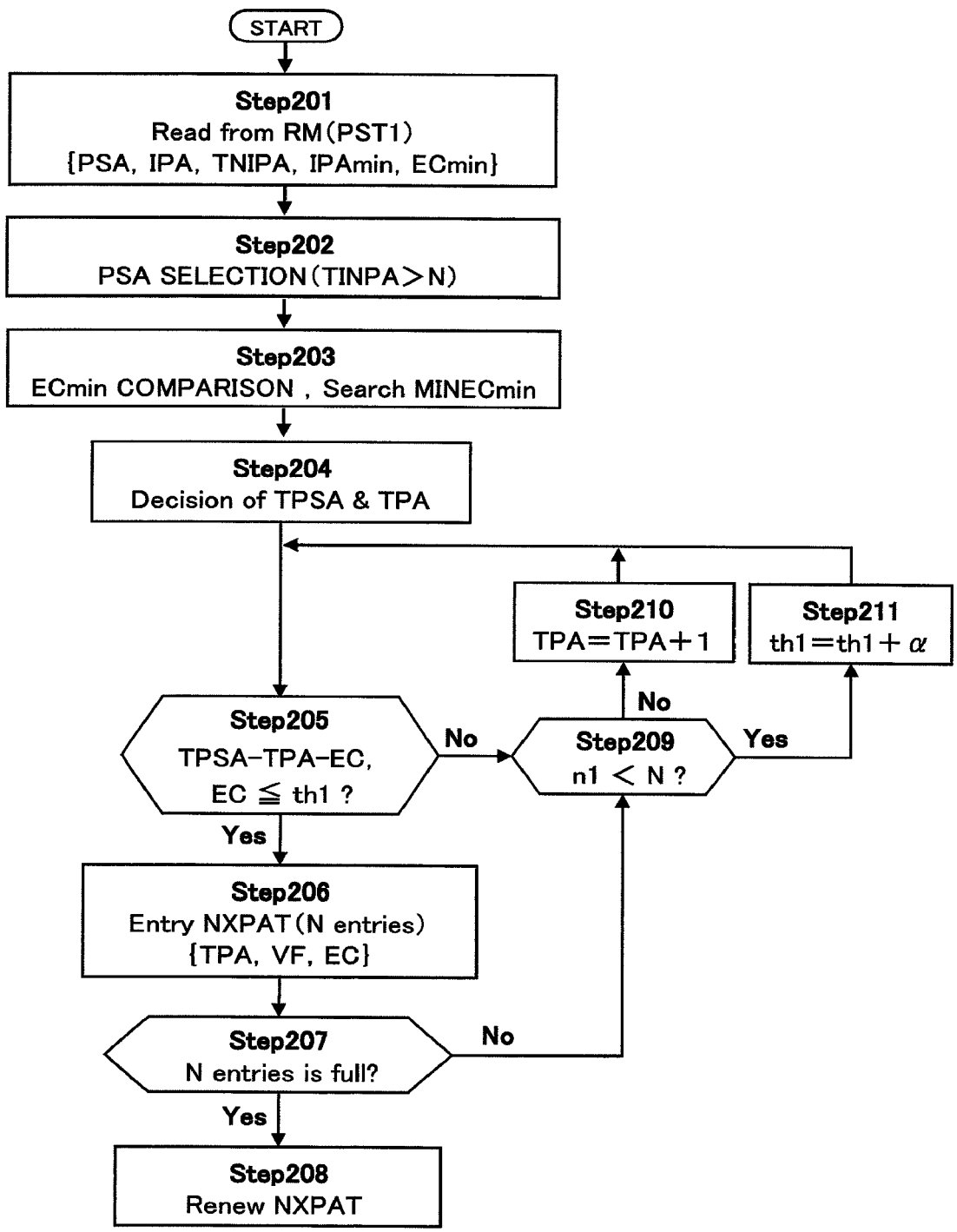
FIG. 10 is a drawing showing an example of a detailed process flow relating to the write physical address table updating process (Step 112) of FIG. 9.

FIG. 10 shows an example of a process flow of update of the write physical address table NXPAT corresponding to Step 112 of FIG. 9 and required for writing data to NVM by the information processing circuit MNG. In order to update NXPAT, MM0 has the flow of determining a physical segment address PSA first and then determining a physical address PA in the PSA. In the manner of PST1 and 2 of FIG. 6 described above, the random access memory RM stores information such as the total number TNIPA of the invalid physical addresses IPA, the total number TNVPA of the valid physical addresses VPA, the physical address IPAmin or VPAmin having the minimum value ECmin of the erase count EC among IPA or VPA, and the minimum erase count ECmin for each physical segment address PSA.

(Step 201) First, MNG reads information such as the total number TNIPA of invalid physical addresses, the invalid physical addresses IPA (corresponding PA) thereof, IPAmin, and ECmin for each physical segment address PSA from RM (PST1, or the like).

(Step 202) Then, MNG selects, from above-described PSA, PSA (corresponding PA) that satisfy the condition that TNIPA read for each PSA described above is larger than the registration number N of the write physical address table NXPAT (TNIPA>N).

(Step 203) Furthermore, MNG compares the minimum erase count values ECmin of each of above-described selected PSA and obtains the minimum value among the ECmin (referred to as MINECmin).

(Step 204) Then, MNG determines the physical segment address PSA (referred to as TPSA) and the corresponding physical address PA (referred to as TPA) for updating the write physical address table NXPAT from the physical segment address PSA having the above-described minimum value MINECmin and the corresponding physical address PA.

In order to cause the physical segment address PSA selected in above-described Step 202 to exist, it is preferred that the size of the space of the physical address (PA) in NVM is made to be equal to or larger than the size of the space of the logical address (LA) by at least the size corresponding to the address (corresponding to N) which can be registered in NXPAT.

(Step 205) Then, MNG reads, from RM, the erase count value EC corresponding to the physical address TPA in the above-described physical segment address TPSA for update and compares the erase count value with a predetermined erase count threshold value (referred to as th1). If EC≤th1 (Yes), the write to the current physical address CPA (TPA) is permitted, and the process goes to Step 206. If EC>th1 (No), the above-described write is prohibited, and the process goes to Step 209.

(Step 209) In Step 209, MNG determines whether the number (referred to as n1) of the invalid physical addresses IPA having the erase counts EC equal to or smaller than the erase count threshold value th1 in the current physical segment address PSA is smaller than the number (N) of the addresses which can be registered in the write physical address table NXPAT (n1<N). If smaller (Yes), the process goes to Step 212. If larger, the process goes to Step 210.

(Step 210) In Step 210, a new sequential physical address CPA (TPA), which is obtained by adding 1 to the current physical address CPA (TPA), is generated, and the process goes to Step 205.

(Step 211) In Step 211, a new erase count threshold value th1, which is obtained by adding a predetermined value a to the erase count threshold value th1, is generated, and the process returns to Step 205.

(Step 206) In Step 206, MNG registers, to the write physical address table NXPAT, the information of the current physical address CPA (TPA) and the information of the valid flag value VF and the erase count value EC corresponding to the CPA (TPA). As shown in FIG. 7, N sets can be registered in NXPAT, and in Step 206 in the present embodiment, the information corresponding to the N sets is registered in the ascending order of the entry numbers ENUM.

In the present embodiment, the above-described N value can be arbitrarily set by MNG, and particularly it is preferably set so that the write speed to the non-volatile memory devices NVM {NVM10 to NVM17} is maximized.

(Step 207) In next Step 207, MNG checks whether the registration of all of the N sets of information to the write physical address table NXPAT has been completed or not. If uncompleted (No), the process goes to Step 209, and if completed (Yes), the process goes to Step 208.

(Step 208) In Step 208, MNG completes the update of the write physical address table NXPAT.

Update Example

Figure 11A:
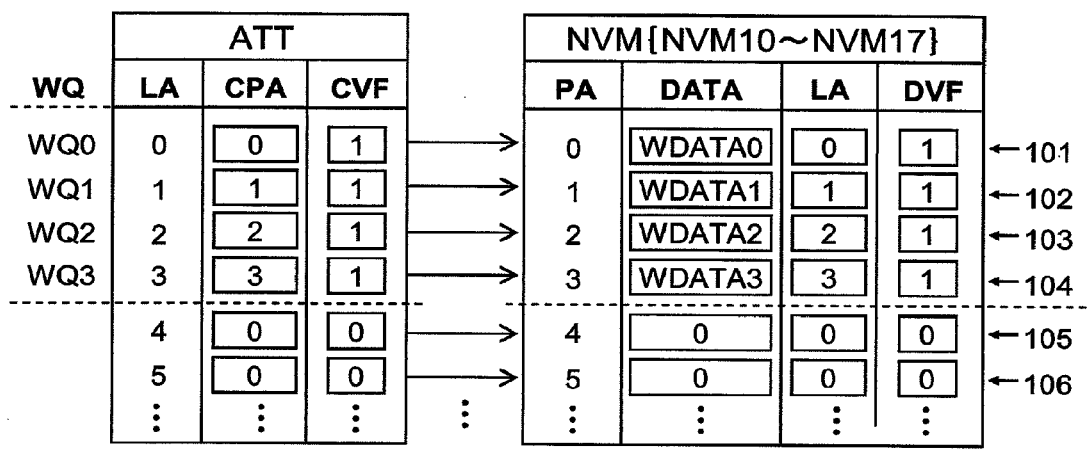
FIG. 11A is an explanatory drawing of an example of updated states of the storage information of the address conversion table (ATT) and the non-volatile memory devices (NVM) at the data writing operation in the memory module, which shows the state corresponding to the processes of write requests RQ0 to RQ3.
Figure 11B:
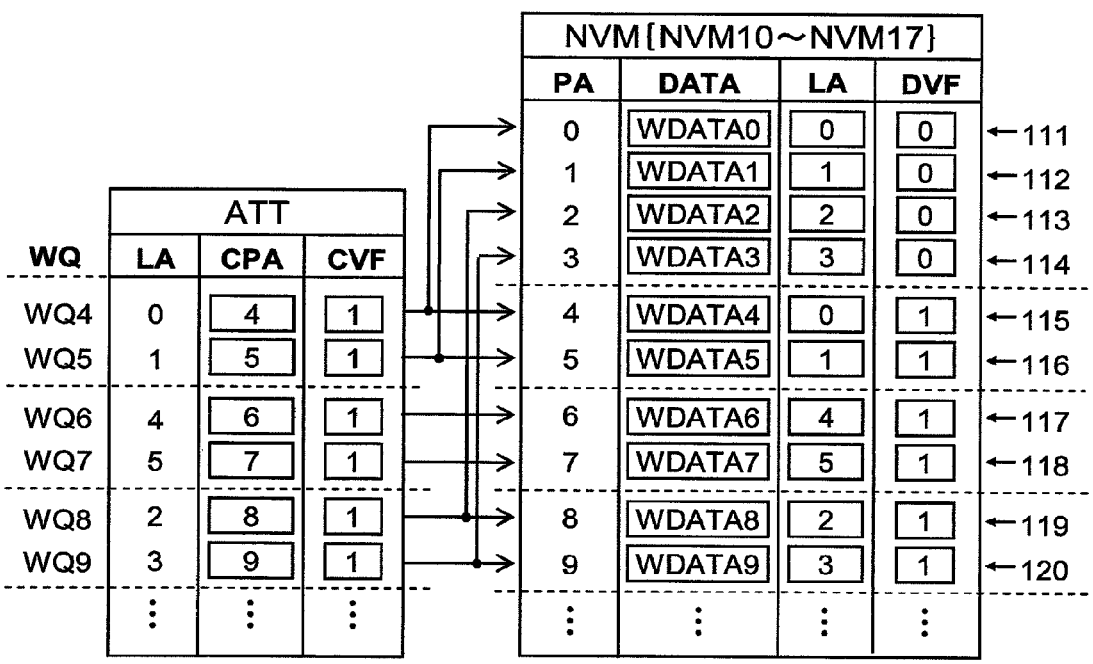
FIG. 11B is an explanatory drawing of an example of updated states of the storage information of the address conversion table (ATT) and the non-volatile memory devices (NVM) at the data writing operation in the memory module, which shows the state corresponding to the processes of write requests RQ4 to RQ9.

FIG. 11 shows examples of update states of the information of the address conversion table ATT and the non-volatile memory devices NVM {NVM10 to NVM17}. FIG. 11A shows the state after the control circuit SC0 has written the data WDATA according to write requests WQ (WQ1 to WQ3) to NVM (after use of NVM is started) with respect to the initial state of ATT and NVM of FIG. 8. Furthermore, FIG. 11B shows the state after the control circuit SC0 has written the data WDATA according to write requests WQ (WQ4 to WQ9) to NVM subsequently to the state of FIG. 11A. Similar to FIG. 8, the values of the addresses, data, flags, and others stored in ATT and NVM are shown.

In the example of FIG. 11A, first, for example four write requests WQ0, WQ1, WQ2, and WQ3 are input from the information processing device CC to the control circuit SC0, and the data (WDATA0 to WDATA3) of these WQ ({logical addresses LA, data write commands WT, sector counts SEC, write data WDATA}) is written to NVM. The first write request WQ0 contains {LA=0, WT, SEC=1, WDATA0}. The second write request WQ1 contains {LA=1, WT, SEC=1, WDATA1}. The third write request WQ2 contains {LA=2, WT, SEC=1, WDATA2}. The fourth write request WQ3 contains {LA=3, WT, SEC=1, WDATA3}.

When above-described WQ0 to WQ3 are input to the control circuit SC0, the interface circuit HIF transfers these write requests WQ to the buffer BUF0. Then, the information processing circuit MNG sequentially reads WQ0 to WQ3 stored in the buffer BUF0. Then, since the logical address values LA of WQ0 to WQ3 are 0, 1, 2, and 3, respectively, MNG reads the corresponding physical address values PA (CPA) and valid flag values VF (CVF) from the location number 0, the location number 1, the location number 2, and the location number 3 of the logical addresses LA of the address conversion table ATT stored in RM through the memory controlling device RMC. At first, since all the read VF (CVF) are 0 (invalid) as shown in FIG. 8, it can be understood that PA has not been allocated to location numbers LA=0 to 3.

Then, MNG reads the physical address values NXPA (in this example, NXPA=0, 1, 2, 3 of FIG. 7A) stored from the number 0 to the number 3 of the entry numbers ENUM (four corresponding to four RQ) of the write physical address table NXPAT (FIG. 7) and allocates the physical address values NXPA to the location numbers 0 to 3 of the logical addresses LA as shown in LA and CPA of ATT of FIG. 11A.

Furthermore, in accordance with the above-described physical address values NXPA (0 to 3), as shown in FIG. 11B, MNG writes the data WDATA0 and the information of LA=0 and DVF=1 of the first write request WQ0 to the region of the location number 0 of the physical address PA of the non-volatile memory device NVM through the arbitration circuit ARB and the memory controlling device NC {NC0 to NC7} (101) Similarly, WDATA1, LA=1, and DVF=1 of WQ1 are written to PA=1 (102), WDATA2, LA=2, DVF=1 of WQ2 are written to PA=2 (103), and WDATA3, LA=3, DVF=1 of WQ3 are written to PA=3 (104).

In the end, as shown in FIG. 11A, in the manner corresponding to 101 to 104 described above, MNG writes the physical address value CPA=0 and the valid flag value CVF=1 with respect to the logical address LA=0 of the address conversion table ATT of RM through the memory controlling device RMC. Similarly, CPA=1 and CVF=1 are written to LA=1, CPA=2 and CVF=1 are written to LA=2, and CPA=3 and CVF=1 are written to LA=3.

FIG. 11B shows the state after six more write requests WQ4, WQ5, WQ6, WQ7, WQ8, and WQ9 are input from the information processing device CC to the control circuit SC0 and the data (WDATA4 to WDATA9) of these WQ has been written to NVM. The fifth write request WQ4 contains {LA=0, WT, SEC=1, WDATA4}. The sixth write request WQ5 contains {LA=1, WT, SEC=1, WDATA5}. The seventh write request WQ6 contains {LA=4, WT, SEC=1, WDATA6}. The eighth write request WQ7 contains {LA=5, WT, SEC=1, WDATA7}. The ninth write request WQ8 contains {LA=2, WT, SEC=1, WDATA8}. The tenth write request WQ9 contains {LA=3, WT, SEC=1, WDATA9}.

When the above-described six write requests WQ4 to WQ9 are input to the control circuit SC0, the interface circuit HIF transfers these WQ to the buffer BUF0. Then, the information processing circuit MNG sequentially reads WQ4 to WQ9 stored in the above-described buffer BUF0. Then, since LA of WQ4 to WQ9 are 0, 1, 4, 5, 2, and 3, respectively, MNG reads the physical address values PA (CPA) and the valid flag values VF (CVF) from the location number 0, the location number 1, the location number 4, the location number 5, the location number 2, and the location number 3 of LA of the address conversion table ATT of RM through the memory controlling device RMC.

Then, as shown in (1) to (6) below, [invalidating operation] (for example, changing the data valid flag value DVF of NVM to 0) is first carried out.

(1) In relation to WQ4, the physical address value CPA=0 and the valid flag value CVF=1 (valid, allocated) correspond to LA=0 of ATT as shown in FIG. 11A. First, in order to invalidate the data (WDATA0) of the physical address PA=0 which has already been written, the information processing circuit MNG sets 0 for DVF having PA=0 of NVM (update from 1 to 0, 101 to 111).

(2) In relation to WQ5, CPA=1 and CVF=1 correspond to LA=1 of ATT, and in order to invalidate the data (WDATA1) of PA=1 which has already been written, DVF of PA=1 of NVM is changed to 0 (102 to 112).

(3) Then, in relation to WQ6, CPA=0 and CVF=0 (invalid, unallocated) correspond to LA=4 of ATT as shown in FIG. 11A, and it can be understood that no physical address PA is allocated to LA=4 (105).

(4) In relation to WQ7, CPA=0 and CVF=0 correspond to LA=5 of ATT, and it can be understood that no physical address PA is allocated to LA=5 (106).

(5) Then, in relation to WQ8, CPA=2 and CVF=1 correspond to LA=2 of ATT, and in order to invalidate the data (WDATA2) of PA=2 of NVM which has already been written, DVF of PA=2 of NVM is changed to 0 (103 to 113).

(6) In relation to WQ9, CPA=3 and CVF=1 correspond to LA=3 of ATT, and in order to invalidate the data (WDATA3) of PA=3 which has already been written, DVF of PA=3 of NVM is changed to 0 (104 to 114).

After the above-described invalidating operation, the information processing circuit MNG writes the data WDATA of WQ and the corresponding information to the regions of NVM in the manner described below.

Since the logical address values LA of above-described WQ4 to WQ9 are 0, 1, 4, 5, 2, and 3, respectively, MNG reads the physical address values NXPA=4, 5, 6, 7, 8, and 9 stored in the number 4 to number 9 of the entry numbers ENUM (six numbers corresponding to six WQ) of the write physical address table NXPAT (FIG. 7) and allocates the NXPA to the location number 0, the location number 1, the location number 4, the location number 5, the location number 2, and the location number 3 of LA like LA and CPA of FIG. 11B.

Furthermore, in accordance with the above-described physical address values NXPA (4 to 9), MNG writes the data WDATA4, the logical address value LA=0, and the data valid flag value DVF=1 of the write request WQ4 to the region of the location number 4 of PA of the non-volatile memory device NVM {NVM 10 to 17} through the arbitration circuit ARB and the memory controlling device NC {NC0 to NC7} (115). Similarly, WDATA5, LA=1, DVF=1 of WQ5 are written to PA=5 (116), WDATA6, LA=4, and DVF=1 of WQ6 are written to PA=6 (117), WDATA7, LA=5, and DVF=1 of WQ7 are written to PA=7 (118), WDATA8, LA=2, and DF=1 of WQ8 are written to PA=8 (119), and WDATA9, LA=3, and DVF=1 of WQ9 are written to PA=9 (120).

[Erasing Operation+Writing Operation]

An example of the setting operation of (a) [erasing operation/invalidating operation]+(b) [writing operation/validating operation] in the present system is as described below. In the case of a data writing operation corresponding to 1 PA (sector) of one time, for example, in the case of writing to the address of a valid flag VF=0 such as the new data writing, as a matter of course, the write is promptly carried out without an erasing operation. If it is the write to the address of a valid flag VF=1 such as the case of an overwrite request, an invalidating operation (update of the VF (DVF) value (1 to 0)) and data erase (reset of all bits) are carried out without overwriting of the first address region, and subsequently, an writing operation of write data with respect to a sequential second address region (region of the next write physical address NXPA where VF=0) which is different from the first address region and a validating operation (update of the VF (DVF) value (0 to 1)) are carried out.

As a modification example, the order of [erasing operation] and [writing operation] can be reversed with respect to the above-described setting operation. Also, regarding [erasing operation], it is also possible to carry out only invalidation (flag value update) first and then carry out data erase (reset) later in terms of time as described above.

Since the present embodiment employs the phase-change memory PM, a resetting operation in which the state of each of all the memory cells serving as data erase targets is set to an amorphous or crystalline state is carried out in the [erasing operation]. The information values of all the memory cells are changed to '1' by the resetting operation (FIG. 16).

[Effects and Others]

As described above, according to the first embodiment, the above-described problems of NAND-type flash memories and resistance-change-type non-volatile memories (for example, life due to the count upper limit, inefficiency of data write and the like, reliability of data read) can be remedied, and long-life, high reliability, high processing performance, and others can be realized by the mechanism that suppresses and smoothes variations in the use (write/erase) of NVM regions by selecting (determining) the address (NXPA) of the next write destination of the non-volatile memory devices NVM (phase-change memories PM) with respect to the data write request (WQ) from the information processing device CC based on management of, for example, the write physical address table NXPAT by the control circuit SC0.

Particularly, read processing performance can be improved and high reliability can be realized by the mechanism that equalizes the sizes of erase and write to realize data write by (a) [erasing operation]+(b) [writing operation] without carrying out overwriting operations to the overwritable NVM (PM), thereby suppressing (uniformizing) variations in the state (resistance value) of resistance-change-type memory cells.

Particularly, long life and high reliability can be realized by the mechanism that suppresses and smoothes variations in the erase counts EC among the memory regions by sequentially allocating the physical addresses PA of NVM to the logical addresses LA, which are from the information processing device CC, and using the allocated addresses (allocating and using sequential PA values without depending on LA values).

The NVM regions are sequentially used in, for example, the ascending order (0, 1, ... ) of PA as shown in FIG. 11 from the start of use of the device (the erase count EC is increased one by one along with use). In addition, the data writing operations are realized by the invalidating operations (111 to 114) and others and the data writing operations (for example, 115 to 120) to the new physical addresses PA based on NXPAT without carrying out overwriting operations (for example, 101 to 104) with respect to the existing storage data of NVM. In this manner, variations in writing/erasing with respect to the NVM regions are suppressed and smoothed. The long life and others of NVM (phase-change memories PM) are realized by this smoothing.

Second Embodiment

An information processing system of the second embodiment will be described with reference to FIG. 12 and others.

The second embodiment shows a second smoothing method (static smoothing method) relating to the data erasing operation (erase count EC) of each physical address PA of the non-volatile memory devices NVM (phase-change memories PM) In the second embodiment, the system configuration and others are similar to those of the first embodiment (FIG. 1 and others), and the processing contents in the control circuit SC0 and others are different.

The first smoothing method shown in FIG. 9, FIG. 10, and others of the first embodiment is a dynamic smoothing method of the erase counts EC with respect to the invalid physical addresses IPA. In this dynamic smoothing method, in relation to the erase counts EC of the NVM regions, the difference between the erase counts EC of the invalid physical addresses IPA and the erase counts EC of the valid physical addresses VPA is increased in some cases along with the use of the present memory module MM0. Therefore, the second embodiment (FIG. 12 and others) shows a static smoothing method that suppresses the above-described variations (differences) between EC of IPA and EC of VPA. In the second embodiment, in order to smooth the erase counts EC, a data moving operation (step 306 and others of FIG. 12) between the physical addresses PA of NVM is carried out. The valid physical address VPA having a small erase count EC among the valid physical addresses VPA means that the data with respect to the logical address LA which is not frequently rewritten is retained. Therefore, data is moved (exchanged) between the valid physical address VPA regions with small erase counts EC and the invalid physical address IPA regions with large erase counts EC, and invalid physical address IPAnew regions with small erase counts EC are newly created. By this means, the subsequent data write is directed to the invalid physical address IPAnew regions with the small erase counts EC, and the erase counts EC of respective physical addresses PA can be smoothed.

[Smoothing Method]

Figure 12:
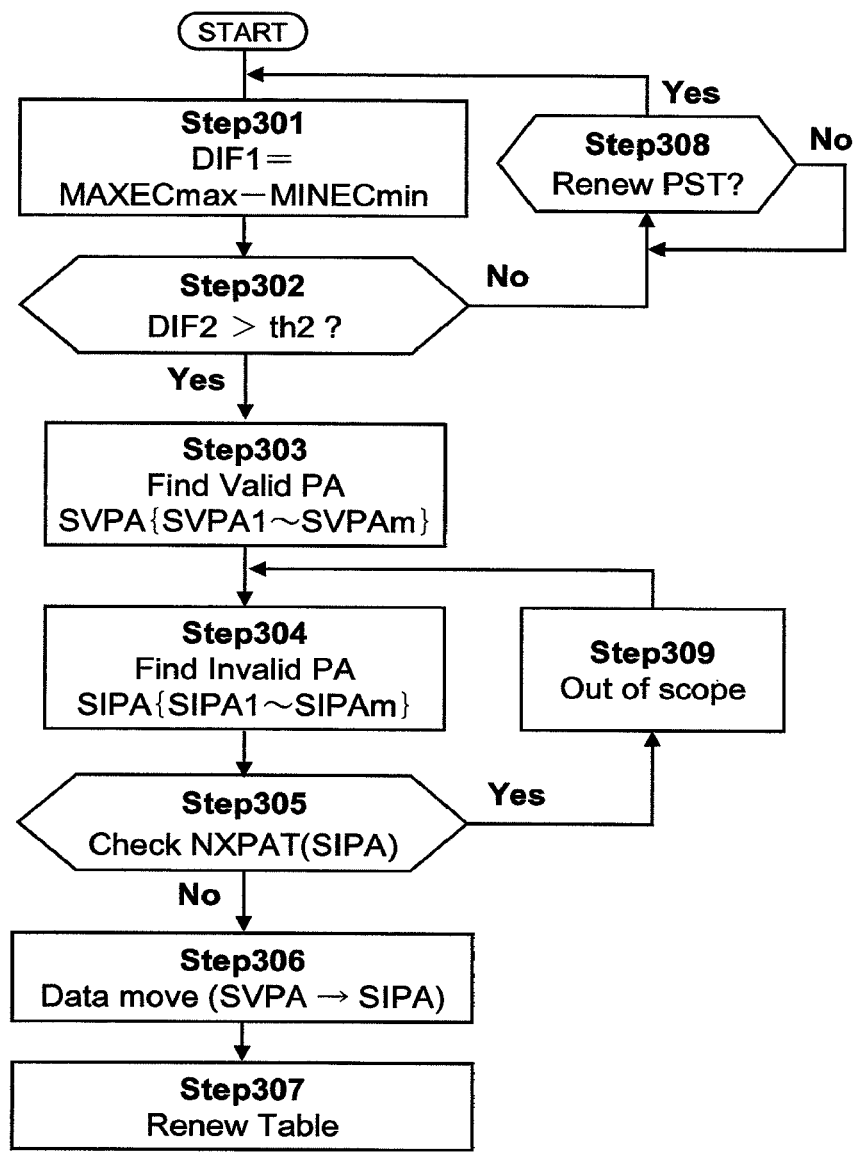
FIG. 12 is a drawing showing an example of a process flow of a memory module corresponding to a second smoothing method in a system of a second embodiment of the present invention.

FIG. 12 shows a process flow which is executed by the control circuit SC0 (information processing circuit MNG) for suppressing and smoothing variations in the erase counts EC of respective physical addresses PA of the non-volatile memory devices NVM (phase-change memories PM).

(Step 301) First, in Step 301, the information processing circuit MNG obtains the difference (referred to as a differential DIF1: DIF1=MAXECmax−MINECmin) between a maximum value MAXECmax among the maximum erase counts ECmax of the invalid physical addresses IPA in the physical segment table PST1 of FIG. 6A and a minimum value MINECmin among the minimum erase counts ECmin of the valid physical addresses VPA in the physical segment table PST2 of FIG. 6B.

(Step 302) Then, in Step 302, MNG sets a predetermined threshold value th2 relating to the difference (referred to as a differential DIF2) between the erase count EC of the invalid physical address IPA and the erase count EC of the valid physical address VPA and compares the differential DIF2 with the threshold value th2 (DIF2>th2). If the differential DIF2 is larger than the threshold value th2 (DIF2>th2), the process proceeds to next Step 303 in order to carry out smoothing of the erase counts EC, and if smaller (DIF23 th2), the process proceeds to Step 308.

(Step 308) In Step 308, MNG determines whether the physical segment table PST (PST1 or PST2) has been updated or not. If updated (Yes), the process returns to Step 301, and the differential DIF1 is obtained again. If neither one of the physical segment tables PST has been updated (No), Step 308 is carried out again.

(Step 303) In Step 303, MNG selects a physical segment address VPSAmin that has the smallest erase count EC among the minimum erase counts ECmin relating to the valid physical addresses VPA in the physical segment table PST2, and further selects a plurality of (m) physical addresses PA (VPA) sequentially from the physical addresses PA having small erase counts EC among the physical addresses PA in the selected physical segment address VPSAmin. These addresses serve as selected valid physical addresses SVPA {SVPA1 to SVPAm}.

(Step 304) In Step 304, MNG selects a physical segment address IPSAmin having the smallest erase count EC among the maximum erase counts ECmax relating to the invalid physical addresses IPA in the physical segment table PST1, and further selects a plurality of (m) physical addresses PA (IPA) sequentially from the physical addresses PA having large erase counts EC among the physical addresses PA in the selected physical segment address IPSAmin. These addresses serve as selected invalid physical addresses SIPA {SIPA1 to SIPAm}.

(Step 305) In Step 305, MNG checks whether the selected invalid physical addresses SIPA {SIPA' to SIPAm} of Step 304 described above are registered in the write physical address table NXPAT or not. If above-described SIPA are registered in NXPAT (Yes), the above-described current selected invalid physical addresses SIPA {SIPA1 to SIPAm} are excluded from the candidates of the physical addresses PA having the minimum values in Step 309, and the process returns to Step 304. If above-described SIPA are not registered in NXPAT (No), the process proceeds to Step 306.

(Step 306) In Step 306, MNG moves the data of the selected valid physical addresses SVPA {SVPA1 to SVPAm} of Step 303 described above to the selected invalid physical addresses SIPA {SIPA1 to SIPAm} of Step 304 described above.

(Step 307) In Step 307, all the tables which are required to be updated as a result of moving the data of the selected valid physical addresses SVPA {SVPA1 to SVPAm} to the selected invalid physical addresses SIPA {SIPA' to SIPAm} in Step 306 described above are updated.

In the above-described example, the data corresponding to m physical addresses PA is moved. The value m can be programmed (set) by the information processing circuit MNG in accordance with, for example, target performance, and 1≤m≤N is preferably set with respect to the registration number N of NXPAT described above.

As described above, according to the second embodiment, long life and others can be realized because of the mechanism that carries out data movement so as to suppress and smooth the variations in EC of IPA and VPA of the NVM regions by the static smoothing method.

Third Embodiment

An information processing system of a third embodiment will be described with reference to FIG. 13 and others. In the configuration of the third embodiment, based on the configuration of the first or second embodiment, a pipeline process relating to data write to the non-volatile memory devices NVM by the memory module MM0 (control circuit SC0) is carried out.

[Pipeline Writing Operation]

Figure 13:
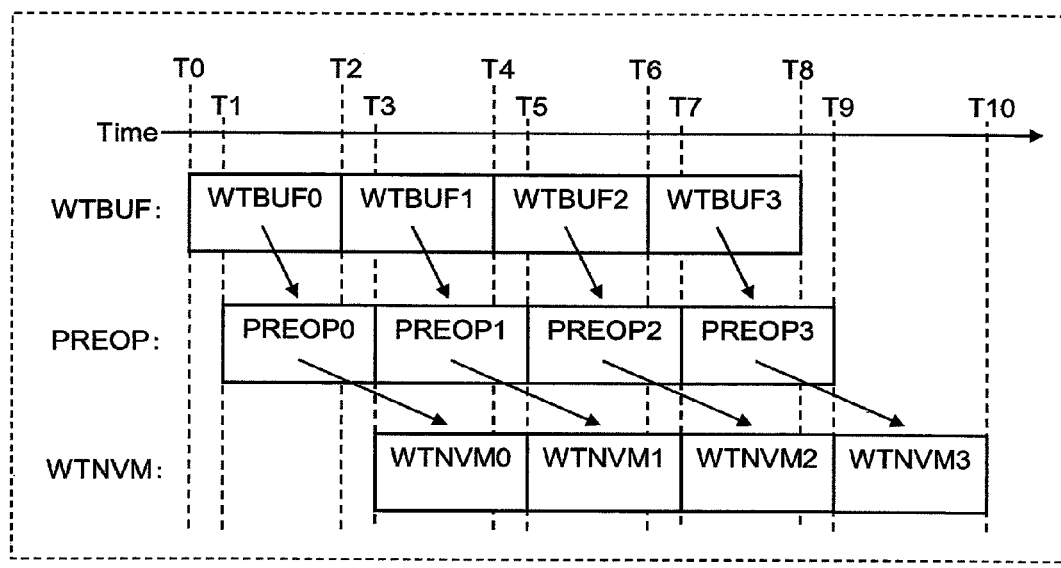
FIG. 13 is an explanatory drawing of an example of a pipeline writing operation of the memory module in a system of a third embodiment of the present invention.

FIG. 13 shows an example of a data writing operation in which a pipeline process is executed in the memory module MM0 in the case in which a plurality of write requests WQ are sequentially generated from the information processing device CC to the memory module MM0. On the horizontal time axis, T0 and others represent the timing relating to pipeline processing units (operations).

Also, in the configuration of the present embodiment, each of the plurality of buffers BUF {BUF0 to BUF3}(FIG. 2) of the control circuit SC0 can store the write data (WDATA) of N×512 bytes. Note that this "N" has a correspondence relation with the registration number N of NXPAT described above.

In FIG. 13, WTBUF represents a buffer transferring operation (transfer (storage) of data (WDATA) to the buffer BUF). As an example, in the four operations, that is, buffer transferring operations WTBUF0, WTBUF1, WTBUF2, and WTBUF3, write requests WQ (containing WDATA) are transferred to the buffers BUF0, BUF1, BUF2, and BUF3. For example, WTBUF0 is carried out in the period from T0 to T2.

PREOP represents an advance preparation operation, which is a predetermined advance preparation operation (including corresponding information processing) for writing the write data (WDATA), which has been transferred (stored) to the buffer BUF by WTBUF, to the non-volatile memory device NVM. As an example, the four operations, that is, advance preparation operations PREOP0, PREOP1, PREOP2, and PREOP3 represent the advance preparation operations for writing the write data (WDATA), which has been transferred to the buffers BUF0, BUF1, BUF2, and BUF3, to NVM. For example, PREOP0 is carried out in the period from T1 shortly after T0 to T3.

WTNVM represents a data writing operation, which is an operation of writing the write data (WDATA), which is stored in the buffer BUF in the PREOP-finished state, to the region of the non-volatile memory device NVM. As an example, the four operations, that is, the data writing operations WTNVM0, WTNVM1, WTNVM2, and WTNVM3 represent the operation of writing the write data (WDATA), which is stored in the buffers BUF0, BUF1, BUF2, and BUF3 in the PREOP-finished state, to the NVM regions. For example, WTNVM0 is carried out in the period from T3 at the end of PREOP0 to T5.

The three types of operations including the buffer transferring operations WTBUF0 to WTBUF3, the advance preparation operations PREOP0 to PREOP3, and the data writing operations WTNVM0 to WTNVM3 realize the pipeline operation by the control circuit SC0. Therefore, the writing speed can be improved.

An example of details of the pipeline process of FIG. 13 corresponding to the configuration of the control circuit SC0 of FIG. 2 will be described below. For example, a plurality of (N) write requests WQ (1) to WQ (N) generated in the period from T0 to T2 are first transferred to the first buffer BUF0 by the interface circuit HIF (WTBUF0). When the first buffer BUF0 becomes the state in which the write data (WDATA) cannot be stored therein (for example, upper limit of the buffer size), a plurality of (N) write requests WQ (N+1) to WQ (2N) generated in the next period from T2 to T4 are transferred to the second buffer BUF1 (WTBUF1). When the second buffer BUF1 becomes the state in which the write data cannot be stored therein, a plurality of (N) write requests WQ (2N+1) to WQ (3N) generated in the next period from T4 to T6 are transferred to the third buffer BUF2 (WTBUF2). When the third buffer BUF2 becomes the state in which the write data cannot be stored therein, a plurality of (N) write requests WQ (3N+1) to WQ (4N) generated in the next period from T6 to T8 are transferred to the fourth buffer BUF3 (WTBUF3). Note that "N" described above has a correspondence relation with the registration number N of NXPAT.

In the period from T1 to T3, the information processing circuit MNG carries out the advance preparation operation PREOP0 for writing the write data (WDATA), which is stored in the buffer BUF0, to NVM. An example of the processing contents of the advance preparation operation PREOP0 carried out by the information processing circuit MNG will be described below.

(1) By utilizing the logical address values LA contained in the above-described write requests WQ (1) to (N), the physical addresses PA associated with the LA are read from the address conversion table ATT, and the valid flag values VF (corresponding data valid flag values DVF) of these PA are changed to 0 in accordance with needs to invalidate the corresponding data DATA.

(2) The address conversion table ATT is updated.

(3) The physical addresses NXPA stored in the write physical address table NXPAT are read, and the logical addresses LA contained in the write requests WQ (1) to (N) are allocated to the addresses NXPA.

(4) The physical segment tables PST (PST1, PST2) are updated.

(5) The physical address table PAT is updated.

(6) The write physical address table NXPAT is updated in order to prepare for the next write.

The other advance preparation operations PREOP1 to PREOP3 are also similar to PREOP0 described above.

Then, in the period from T3 to T5, the information processing circuit MNG carries out the data writing operation WTNVM0 of writing the write data (WDATA), which is stored in the buffer BUF0, to the non-volatile memory device NVM. In this process, the physical addresses PA of NVM to which the data (WDATA) is written are equal to the physical address values NXPA allocated in (3) described above.

The other data writing operations WTNVM1 to WTNVM3 are also similar to WTNVM0 described above.

When the data erasing operation of each PA region is to be carried out, the operation may be carried out in the advance preparation operation PREOP or in the data writing operation WTNVM. Alternatively, in the pipeline process, the data erasing operation may be separately carried out in a different processing unit in above-described (a) [erasing operation] and (b) [writing operation].

As described above, in the third embodiment, higher performance can be realized in addition to the effects of the above-described first embodiment and others by the mechanism in which the control circuit SC0 carries out the pipeline process of the operation of storing the write requests WQ (WDATA) to the buffer BUF (WTBUF), the advance preparation operation (PREOP) of write, and the operation of writing data (WTNVM) to NVM (phase-change memory).

<Data Reading Operation>

Figure 14:
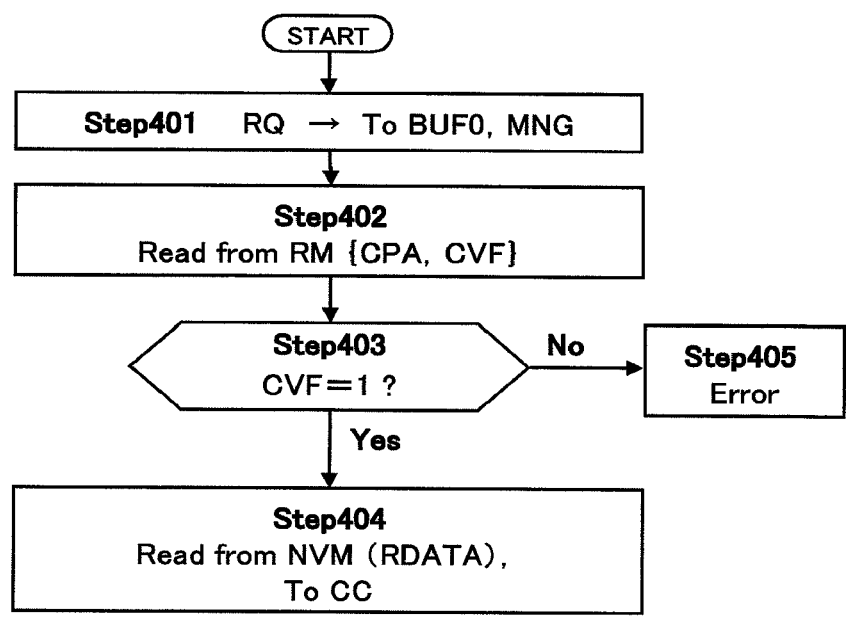
FIG. 14 is a drawing showing an example of a process flow of a data reading operation of the memory module in each of the embodiments of the present invention.

FIG. 14 shows an example of a process flow of a data reading operation carried out by the memory module MM0 when a read request RQ (FIG. 1) is input from the information processing device CC to the memory module MM0. This reading process is approximately the same in each of the embodiments.

(Step 401) For example, a read request RQ01 { logical address value LA (for example: 0), data reading command RD, sector count value SEC (for example: 1)} is input from the information processing device CC to the control circuit SC0. The reading target data is referred to as RDATA01. The interface circuit HIF takes out the clock information embedded in the read request RQ01, converts the read request RQ01, which has been processed into serial data, to parallel data, and transfers the data to the buffer BUF0 and the information processing circuit MNG.

(Step 402) Then, the information processing circuit MNG decodes the logical address value LA (for example: 0), the data reading command RD, and the sector count SEC (for example: 1) of RQ01 and reads the physical address value PA (CPA) (for example: 0) stored in the location number 0 of LA of the address conversion table ATT stored in RM and the valid flag value CVF corresponding to this PA (CPA) (for example: 0).

(Step 403) Then, the information processing circuit MNG checks whether the above-described read valid flag value CVF is 1 or not.

(Step 405) The case of CVF=0 described above (No) represents that no physical address PA is allocated to the location number 0 of LA, and no data can be read from the non-volatile memory device NVM. Therefore, the information processing circuit MNG informs the information processing device CC through the interface circuit HIF that an error has occurred.

(Step 404) The case of CVF=1 described above (Yes) represents that the location number 0 of the physical address PA corresponds (is allocated) to the location number 0 of LA. Therefore, through the arbitration circuit ARB and the memory controlling devices NC {NC0 to NC7}, the information processing circuit MNG reads data (RDATA01) from the location number 0 of PA of the non-volatile memory device NVM {NVM10 to NVM17}. Furthermore, the read data (RDATA01) is transferred to the information processing device CC through the memory controlling device NC {NC0 to NC7}, the arbitration circuit ARB, the information processing circuit MNG, and the interface circuit HIF.

Fourth Embodiment

FIG. 15 shows the configuration of a control circuit SC1 in a fourth embodiment. The control circuit SC1 is a modification example of the control circuit SC0 of FIG. 2 and is different in that a plurality of (four) write physical address tables NXPAT0 to NXPAT3 are provided. Similar to FIG. 7, the information of the plurality of (N) physical addresses NXPA is registered in NXPAT0 to NXPAT3. In other words, the total registration number is N×4.

In the case in which the plurality of write physical address tables NXPAT (NXPAT0 to NXPAT3) are provided like the control circuit SC1 of the fourth embodiment, MNG carries out management and an updating process (similar to FIG. 10) of each of the tables NXPAT independently. Therefore, there are effects such as improvement in the transfer speed of write data to the plurality of non-volatile memory devices NVM {NVM10 to NVM17}.

In the foregoing, the invention made by the inventor of the present invention has been concretely described based on the embodiments. However, it is needless to say that the present invention is not limited to the foregoing embodiments and various modifications and alterations can be made within the scope of the present invention.

For example, with respect to the method of allocating and using the physical address PA values of the NVM regions, in the configuration described above, the PA values of NVM are used from the beginning in the ascending order (0, 1, ...) as shown in FIG. 8 and FIG. 11 from the start of use of the device, and when all of them are once used up to last PA of NVM, the use is similarly repeated by returning to the first PA (0). However, the order of starting the use of PA at first is not limited to this. For example, the order may be the descending order of PA, or for example, skipped (non-sequential) PA may be used. In any cases, similar effects (long life and others) achieved by the above-described smoothing of the variations in the write/erase can be similarly realized by the mechanism that registers the addresses (NXPA) having small erase counts EC or the like to NXPAT.

The information processing system (control circuit SC0) may carry out the operation of erasing the stored data explicitly later in terms of time for the above-described PA region, which has been subjected to the invalidating operation. When the erasing operation is carried out later, since only update of the flag value is required in the writing, writing performance is enhanced. Particularly, in the case of the configuration in which allowance is provided for the size of the PA space of NVM in consideration of the size of the LA space, the erasing operation can be easily carried out later in terms of time and is thus advantageous.

The management (update) of the erase counts EC can be carried out in accordance with the timing of, for example, invalidating, the corresponding data erasing operation, or data writing operation. In this mechanism, since the erasing operation and the writing operation are a set and have a correspondence relation in terms of the number of times, EC can be considered as the number of times of write. The counting of EC may not be limited to the cumulative counting from the start of use of MM0 (NVM). Even in the configuration in which the counting is started over within a predetermined range, since the function of smoothing is achieved in that range, the corresponding effects of long life and the like can be obtained.

The present invention can be utilized in, for example, a non-volatile memory device and an information processing system thereof.

What is claimed is:

1. A semiconductor device comprising:
   a non-volatile memory device; and
   a control circuit device configured to access the non-volatile memory device,
   wherein the control circuit device carries out, with respect to a first write request from outside including a first address serving as a first-type address and first data, control of allocating a second-type address of the non-volatile memory device to the first-type address independently from the first-type address,
   wherein the control circuit device allocates a second address serving as the second-type address to the first address of the first write request, and
   wherein, during a writing operation of the first data to the second address of the non-volatile memory device, the control circuit device allocates a fourth address serving as the second-type address to a third address of a second write request from outside, the third address serving as the first-type address.

2. The semiconductor device according to claim 1,
   wherein the control circuit device includes a first table, and registers a number N of the second-type addresses to the first table during the first writing operation, N being one or more.

3. The semiconductor device according to claim 2,
   wherein the control circuit device carries out data writing and erasing to the non-volatile memory device and registers addresses, at which data has already been erased, from among the second-type addresses to the first table.

4. The semiconductor device according to claim 3,
   wherein the control circuit device allocates the second-type address registered to the first table to the first-type address and writes data to the second-type address of the non volatile memory device.

5. The semiconductor device according to claim 2, further comprising:

a memory device configured to retain data included in a write request input from outside to the control circuit device, wherein a capacity of the memory device is equal to or larger than a capacity of data written at the number N of the second-type addresses registered to the first table.

6. The semiconductor device according to claim 5, wherein the memory device is provided in the control circuit device.

7. The semiconductor device according to claim 2, wherein the number N can be programmed by the control circuit device.

* * * * *